United States Patent
Joo

(10) Patent No.: US 10,818,339 B2
(45) Date of Patent: Oct. 27, 2020

(54) SEMICONDUCTOR MEMORY APPARATUS AND REFRESH METHOD OF THE SEMICONDUCTOR MEMORY APPARATUS

(71) Applicant: SK hynix Inc., Icheon-si, Gyeonggi-do (KR)

(72) Inventor: No Geun Joo, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/399,362

(22) Filed: Apr. 30, 2019

(65) Prior Publication Data

US 2020/0051617 A1  Feb. 13, 2020

(30) Foreign Application Priority Data

Aug. 9, 2018 (KR) .......................... 10-2018-0092786

(51) Int. Cl.
*G11C 7/00* (2006.01)
*G11C 11/406* (2006.01)
*G11C 11/408* (2006.01)

(52) U.S. Cl.
CPC .... *G11C 11/40618* (2013.01); *G11C 11/4087* (2013.01)

(58) Field of Classification Search
CPC ............ G11C 11/406; G11C 11/40618; G11C 11/40615; G11C 11/40611; G11C 11/40626; G11C 11/40622; G11C 11/4087; G11C 11/4076; G11C 2211/4067; G11C 7/222; G11C 7/00
USPC .. 365/222, 194, 230.03, 230.09, 233.1, 149, 365/189.05, 202, 219, 230.08, 236, 365/185.25, 189.07, 191, 195
See application file for complete search history.

(56) References Cited

U.S. PATENT DOCUMENTS 9,721,640 B2   8/2017 Bains et al.
2011/0161578 A1*  6/2011 Kim ..................... G11C 11/406
                                        711/106

FOREIGN PATENT DOCUMENTS

KR    1020140073934 A    6/2014

* cited by examiner

*Primary Examiner* — Thong Q Le
(74) *Attorney, Agent, or Firm* — William Park & Associates Ltd.

(57) ABSTRACT

A semiconductor memory apparatus includes a plurality of memory banks and a refresh control circuit. The refresh control circuit, in each plurality of cycles, performs a refresh operation on at least one memory bank of the plurality of memory banks at a first refresh rate, and performs a refresh operation on the other memory banks of the plurality of memory banks at a second refresh rate. The refresh control circuit circulates the at least one memory bank on which the refresh operation is performed at the first refresh rate in each one or more cycles of the plurality of cycles.

25 Claims, 14 Drawing Sheets

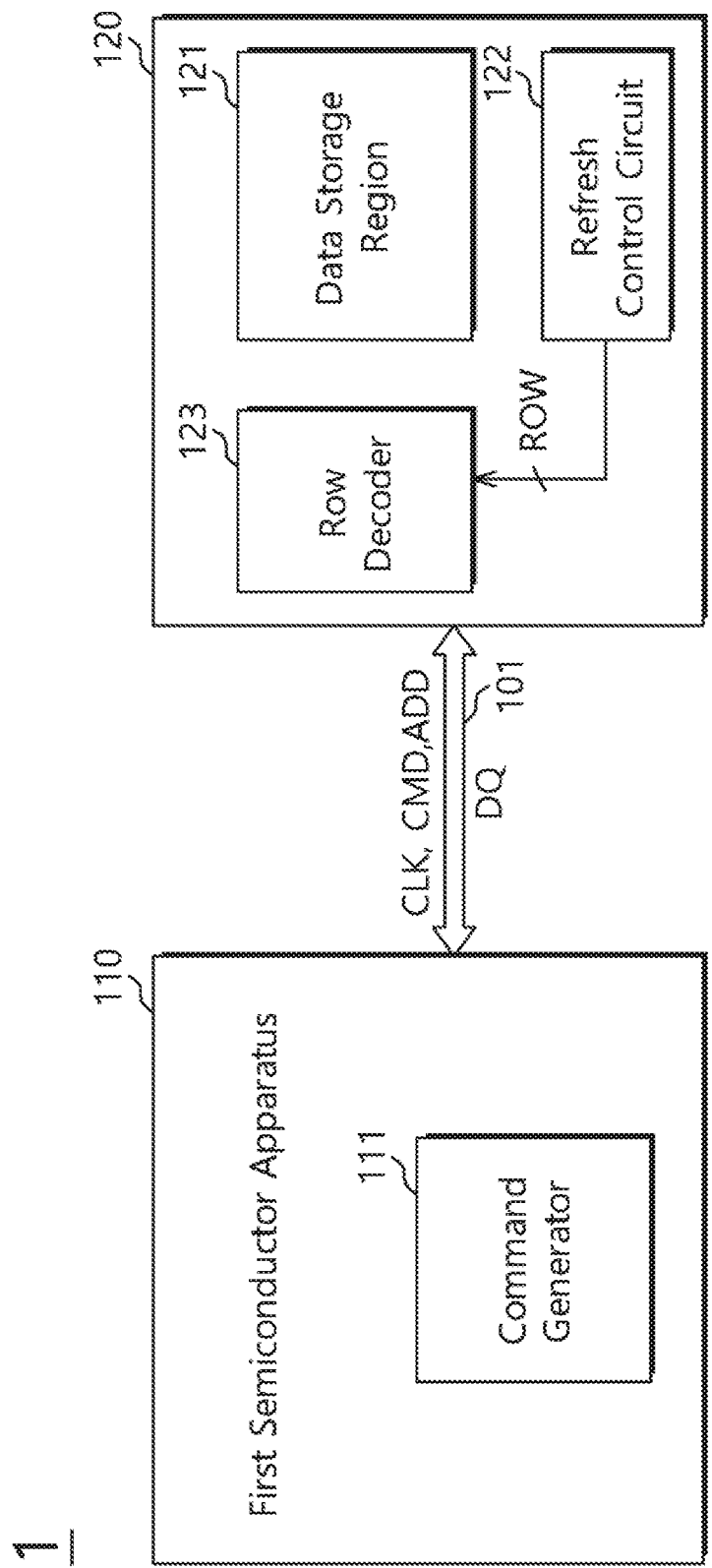

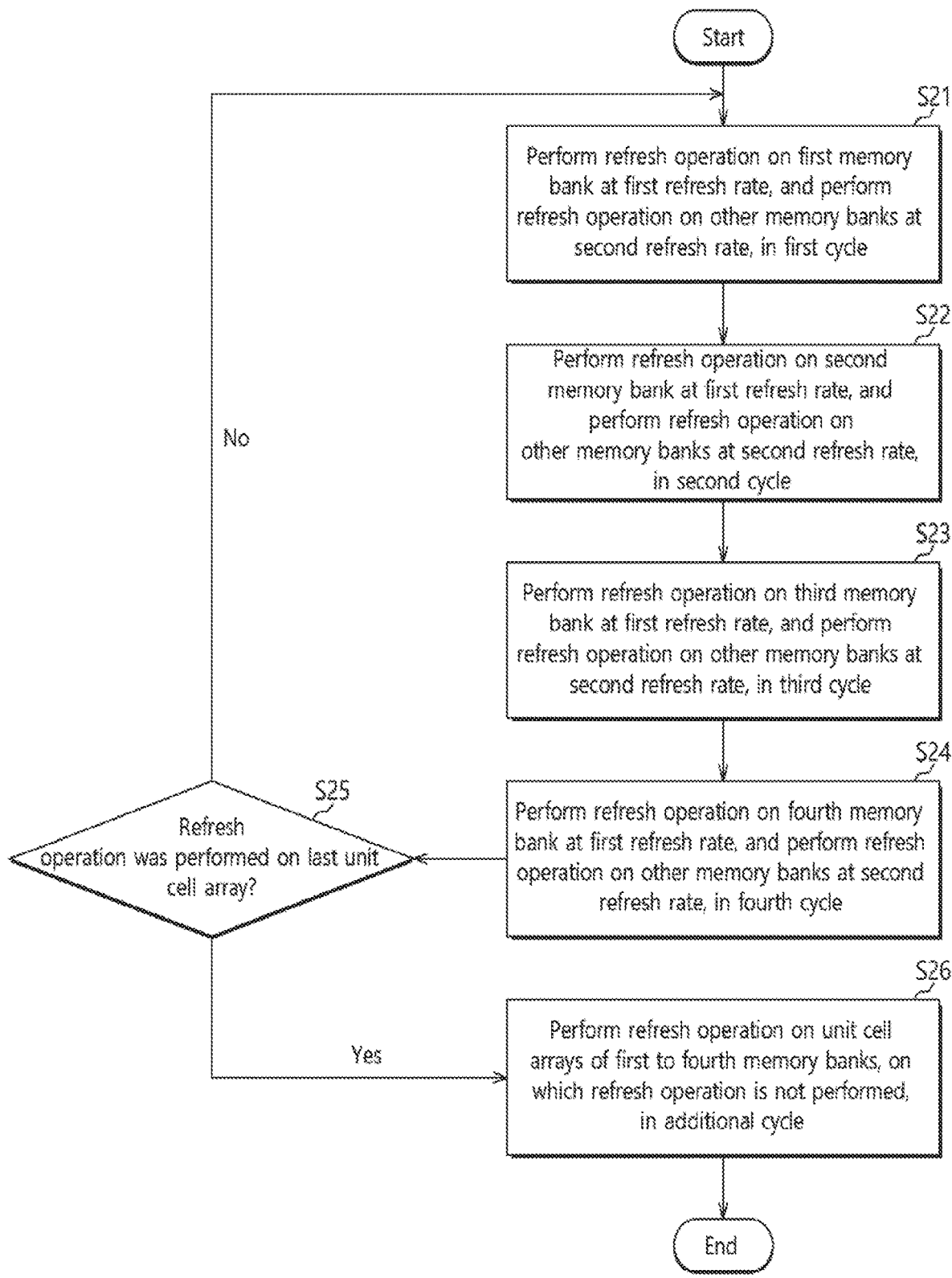

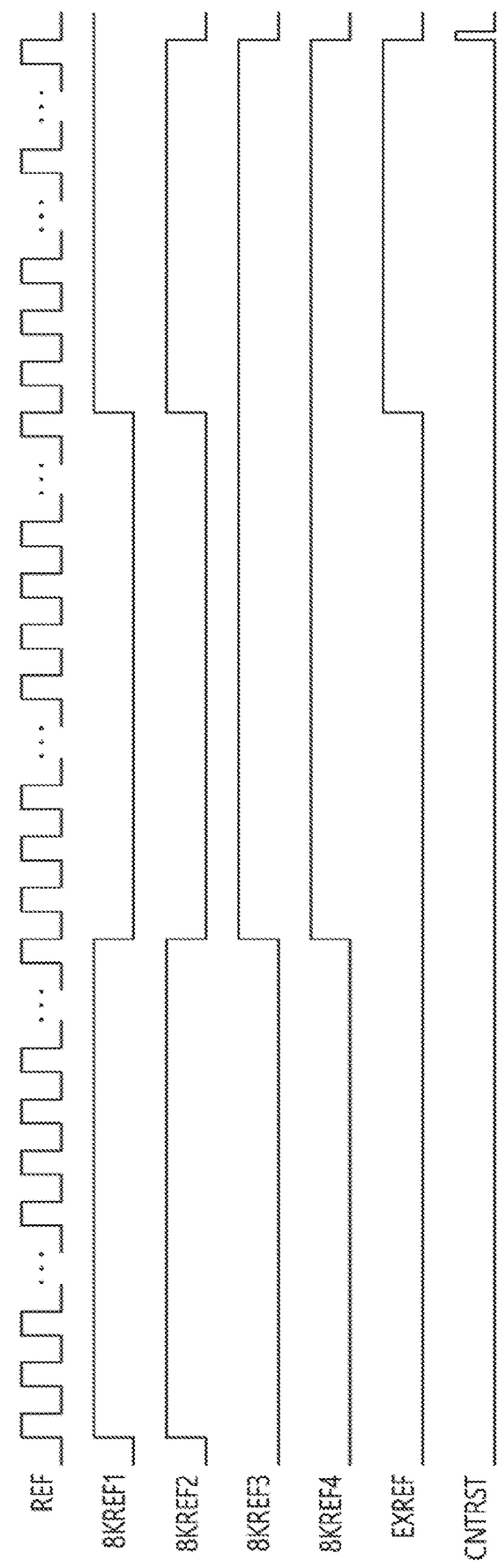

SEMICONDUCTOR MEMORY APPARATUS AND REFRESH METHOD OF THE SEMICONDUCTOR MEMORY APPARATUS

CROSS-REFERENCES TO RELATED APPLICATION

The present application claims priority under 35 U.S.C. § 119(a) to Korean application number 10-2018-0092786, filed on Aug. 9, 2018, in the Korean Intellectual Property Office, which is incorporated herein by reference in its entirety.

BACKGROUND

1. Technical Field

Various embodiments generally relate to an integrated circuit technology, and more particularly, to a semiconductor memory apparatus and a refresh method thereof.

2. Related Art

Electronic devices may include many electronic components. A computer system, for example, may include a large number of semiconductor apparatuses having semiconductors. The computer system may include a data storage device and a processor operating as a host device. The processor may perform an operation on various types of data and store the resultant data in the data storage device. The processor may also receive data stored in the data storage device. The processor may operate at relatively high speed while the data storage device may operate at relatively low speed. Therefore, the computer system may include a memory device to facilitate the transfer of data between the processor and the data storage device.

Representative examples of such a memory device may include dynamic random access memory (DRAM). The DRAM may include a memory cell configured as a capacitor and may perform a data input/output operations at high speed. Furthermore, because the DRAM can be designed to have a wide bandwidth, the DRAM is most frequently used as the memory device. However, the DRAM has the characteristic of volatile memory which does not retain data stored therein, due to the characteristic of the memory cell composed of a capacitor. Thus, the DRAM needs to retain the data stored in the memory cell by periodically performing a refresh operation. Recently, nonvolatile memory, such as resistive RAM, phase change RAM, or magnetic RAM, also perform refresh operations to retain data.

SUMMARY

In an embodiment, a semiconductor memory apparatus may include a plurality of memory banks and a refresh control circuit. The refresh control circuit may be configured to, in each plurality of cycles, perform a refresh operation on at least one memory bank of the plurality of memory banks at a first refresh rate and perform a refresh operation on the other memory banks of the plurality of memory banks at a second refresh rate. The refresh control circuit may circulate the at least one memory bank on which the refresh operation is performed at the first refresh rate in each one or more cycles of the plurality of cycles.

In an embodiment, there is provided a refresh method of a semiconductor memory apparatus which includes first and second memory banks each having at least four unit cell arrays. The refresh method may include performing, during a first cycle, a refresh operation on a first unit cell array of the first memory bank, and performing a refresh operation on first and third unit cell arrays of the second memory bank. The refresh method may include performing, during a second cycle, a refresh operation on second and fourth unit cell arrays of the first memory bank, and performing a refresh operation on second unit cell array of the second memory bank. In another embodiment, the refresh method may further include performing a refresh operation on a third unit cell array of the first memory bank and a fourth unit cell array of the second memory bank during an additional cycle.

In an embodiment, there is provided a refresh method of a semiconductor memory apparatus which includes first, second, third, and fourth memory banks each having at least eight unit cell arrays. The refresh method may include performing, during a first cycle, a refresh operation on a first unit cell array of the first memory bank, and performing a refresh operation on first and fifth unit cell arrays of the second to fourth memory banks. The refresh method may include performing, during a second cycle, a refresh operation on second unit cell arrays of the second memory bank, and performing a refresh operation on second and sixth unit cell arrays of the first, third and fourth memory banks.

In an embodiment, there is provided a refresh method of a semiconductor memory apparatus which includes first and fourth memory banks each having at least eight unit cell arrays. The refresh method may include performing, during a first cycle, a refresh operation on first unit cell arrays of the first and second memory banks, and performing a refresh operation on first and fifth unit cell arrays of the third and fourth memory banks. The refresh method may include performing, during a second cycle, a refresh operation on second unit cell arrays of the first and second memory banks, and performing a refresh operation on second and sixth unit cell arrays of the third and fourth memory banks.

BRIEF DESCRIPTION OF THE DRAWINGS

FIG. 1 illustrates a configuration of a semiconductor system, in accordance with an embodiment.

FIGS. 2A, 2B, and 2C illustrate a semiconductor memory apparatus and a refresh method thereof, in accordance with an embodiment.

FIG. 10 shows a timing diagram illustrating an operation of a semiconductor memory apparatus, in accordance with the present embodiment, in a second refresh mode.

DETAILED DESCRIPTION

Figure 2A:
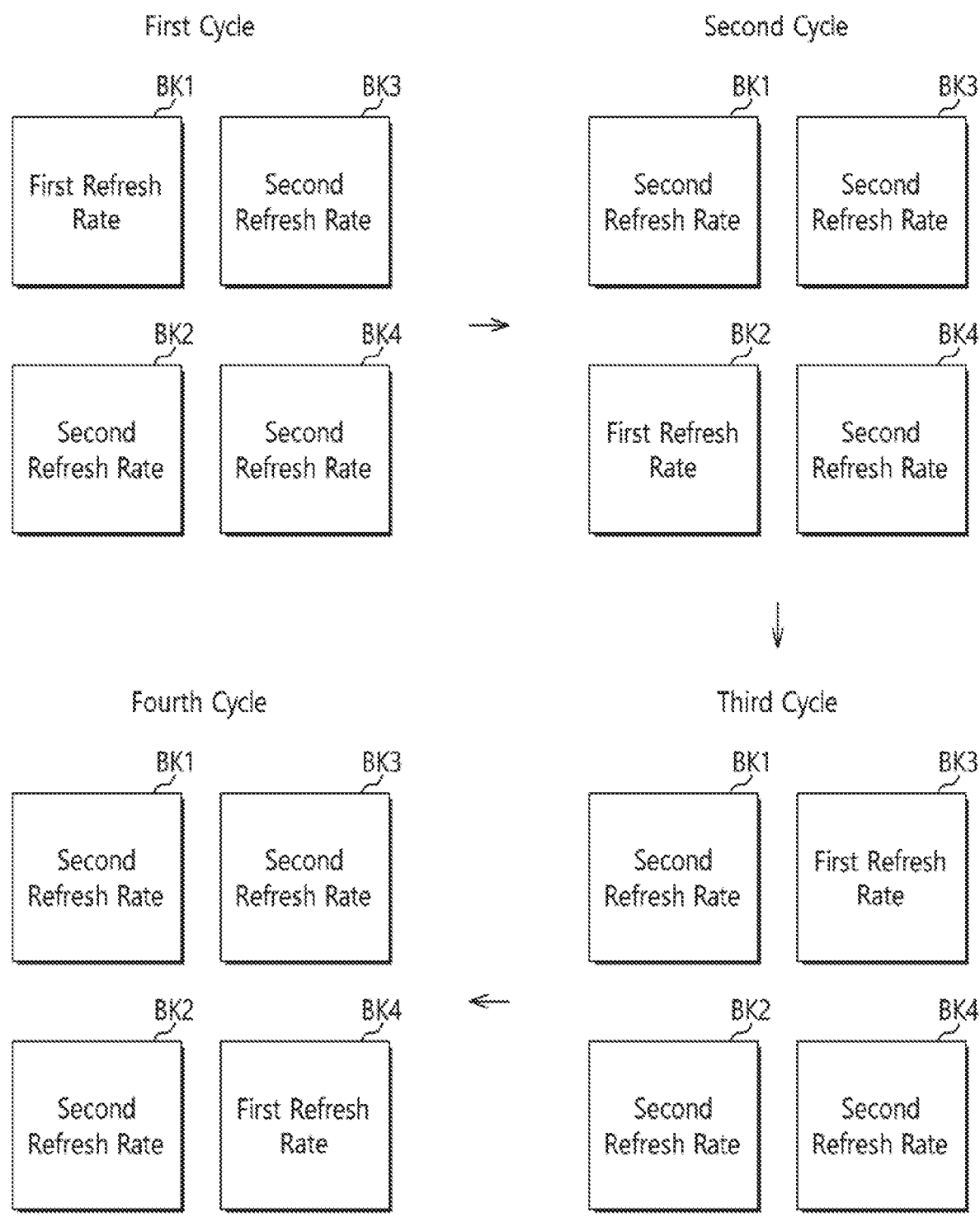

FIG. 1 illustrates a configuration of a semiconductor system 1, in accordance with an embodiment. In FIG. 1, the semiconductor system 1 may include first and second semiconductor apparatuses 110 and 120. The first semiconductor apparatus 110 may provide various control signals for operating the second semiconductor apparatus 120. The first semiconductor apparatus 110 may include various types of apparatuses. For example, the first semiconductor apparatus 110 may be a host device, such as a central processing unit (CPU), graphic processing unit (GPU), multi-media processor (MMP), digital signal processor, application processor (AP), or memory controller. The second semiconductor apparatus 120 may be a memory apparatus, and the memory apparatus may include volatile memory and nonvolatile memory. The volatile memory may include dynamic RAM (DRAM) and synchronous DRAM (SDRAM). The nonvolatile memory may include phase change Memory (PCM), magnetic RAM (MRAM), resistive RAM (RRAM), ferroelectric RAM (FRAM), and the like. Although specific examples of the second semiconductor apparatus 120 are given, the second semiconductor apparatus 120 may include any type of memory which requires a refresh operation to retain data over time The second semiconductor apparatus 120 may be coupled to the first semiconductor apparatus 110 through a bus 101. The bus 101 may include signal transfer paths, links, and/or channels for transferring signals. The bus 101 may include a clock bus, command bus, address bus, data bus, and the like. The clock bus, the command bus, and the address bus may be unidirectional buses, and the data bus may be a bidirectional bus. The second semiconductor apparatus 120 may be coupled to the first semiconductor apparatus 110 through the clock bus, and may receive a clock signal CLK through the clock bus. The clock signal CLK may include one or more clock signal pairs. The second semiconductor apparatus 120 may receive a command signal CMD transferred from the first semiconductor apparatus 110 through the command bus. The second semiconductor apparatus 120 may receive an address signal ADD transferred from the first semiconductor apparatus 110 through the address bus. The second semiconductor apparatus 120 may be coupled to the first semiconductor apparatus 110 through the data bus, and may receive data DQ from the first semiconductor apparatus 110 or may transfer data DQ to the semiconductor apparatus 110 through the data bus. The first semiconductor apparatus 110 may provide the command signal CMD for controlling the second semiconductor apparatus 120 to perform a refresh operation. Furthermore, the first semiconductor apparatus 110 may provide the command signal CMD for controlling the second semiconductor apparatus 120 to operate in various refresh modes. The first semiconductor apparatus 110 may include a command generator 111 for generating the command signal CMD. The command generator 111 may generate the command signal CMD for controlling the second semiconductor apparatus 120 to perform a refresh operation, using any information, such as temperature and time, which is related to whether a refresh operation for the second semiconductor apparatus 120 is needed.

The second semiconductor apparatus 120 may include a data storage region 121, a refresh control circuit 122, and a row decoder 123. The data storage region 121 may include a plurality of memory cell arrays. The data storage region 121 may include a plurality of word lines arranged in a row direction and a plurality of bit liens arranged in a column direction. A plurality of memory cells may be coupled to the respective intersections between the plurality of word lines and the plurality of bit lines. The second semiconductor apparatus 120 may perform a refresh operation on the data storage region 121, based on the command signal CMD transferred from the first semiconductor apparatus 110. Alternatively, the second semiconductor apparatus 120 may autonomously perform a refresh operation on the data storage region 121. The refresh operation may refer to an operation of activating the plurality of word lines to retain data stored in the memory cells.

The refresh control circuit 122 may generate a row address signal ROW to perform a refresh operation. The row address signal ROW might not be generated from the address signal ADD transferred through the bus 101, but generated from an address signal generated through a counting circuit within the refresh control circuit 122. The refresh control circuit 122 may generate the row address signal ROW to perform a refresh operation on the data storage region 121. The refresh control circuit 122 may generate the row address signal ROW based on the command signal CMD or an autonomously generated refresh signal, in order to perform the refresh operation.

The row decoder 123 may receive the row address signal ROW. The row decoder 123 may select a word line of the data storage region 121 based on the row address signal ROW, and may activate the selected word line. The refresh operation may be performed on memory cells coupled to the activated word line.

Figure 2B:
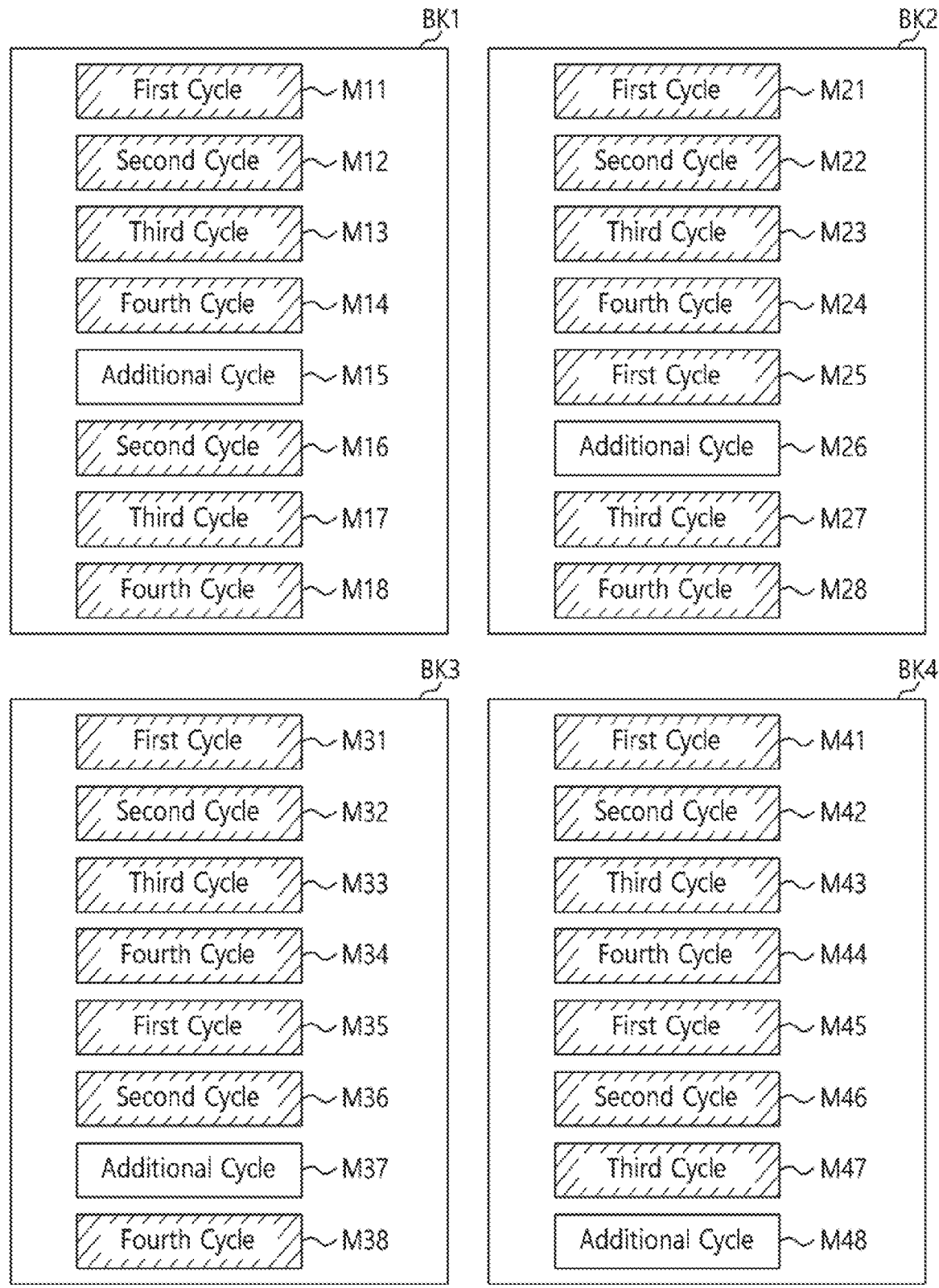

FIGS. 2A, 2B, and 2C illustrate a semiconductor memory apparatus and a refresh method thereof, in accordance with an embodiment. FIG. 2A conceptually illustrates a refresh operation of the semiconductor memory apparatus in accordance with an embodiment. In FIG. 2A, the semiconductor memory apparatus may include a plurality of memory banks. The plurality of memory banks may constitute the data storage region 121 illustrated in FIG. 1. In the present embodiment, the semiconductor memory apparatus may perform a refresh operation on the plurality of memory banks. The semiconductor memory apparatus may perform a refresh operation on the plurality of memory banks during a plurality of cycles. The semiconductor memory apparatus may refresh one or more memory banks of the plurality of memory banks at a first refresh rate, and refresh the other memory banks at a second refresh rate, in each plurality of cycles. The refresh rate may indicate the number or size of unit cell arrays on which the refresh operation is performed in one cycle. For example, when the refresh operation is performed at the first refresh rate, it may indicate that the refresh operation is performed on one unit cell array during one cycle. Furthermore, when the refresh operation is performed at the second refresh rate, it may indicate that the refresh operation is performed on a plurality of unit cell arrays during one cycle. For example, the refresh operation performed at the second refresh rate may indicate that a refresh operation is performed on two unit cell arrays during one cycle. When a refresh operation is performed at the first refresh rate, a peak current can be reduced, and when a refresh operation is performed at the second refresh rate, the refresh operation can be completed within a short time. By refreshing some memory banks at the first refresh rate and refreshing the other memory banks at the second refresh rate in each plurality of cycles, the semiconductor memory apparatus can perform the refresh operation at high speed while reducing the peak current.

The semiconductor memory apparatus may circulate the memory bank which is refreshed at the first refresh rate, in each cycle of the plurality cycles. For example, when a memory bank is refreshed at the first refresh rate in a first cycle, the memory bank may be refreshed at the second refresh rate in a second cycle. FIG. 2A illustrates that the semiconductor memory apparatus includes four memory banks BK1, BK2, BK3, and BK4, in order to clarify description. FIG. 2A illustrates refresh operations which are performed on the first to fourth memory banks BK1 to BK4 during four cycles. During the first cycle, the first memory bank BK1 may be refreshed at the first refresh rate, and the second to fourth memory banks BK2 to BK4 may be refreshed at the second refresh rate. During the second cycle, the second memory bank BK2 may be refreshed at the first refresh rate, and the first, third, and fourth memory banks BK1, BK3, and BK4 may be refreshed at the second refresh rate. During the third cycle, the third memory bank BK3 may be refreshed at the first refresh rate, and the first, second, and fourth memory banks BK1, BK2, and BK4 may be refreshed at the second refresh rate. During the fourth cycle, the fourth memory bank BK4 may be refreshed at the first refresh rate, and the first to third memory banks BK1 to BK3 may be refreshed at the second refresh rate.

FIG. 2B illustrates the configuration of the memory banks of FIG. 2 and the refresh operation in more detail. In FIG. 2B, each of the first to fourth memory banks BK1 to BK4 may include a plurality of unit cell arrays. The unit cell array may indicate the size of a memory cell array which can be refreshed during one cycle. Each of the first to fourth memory banks BK1 to BK4 may include 2n unit cell arrays, for example. Here, n may be an integer equal to or more than 2. In order to refresh all of the unit cell arrays of the first to fourth memory banks BK1 to BK4, the refresh operation may be performed during (n+1) cycles. Each of the first to fourth memory banks BK1 to BK4 may include eight unit cell arrays. FIG. 2B illustrates that each of the first to fourth memory banks BK1 to BK4 includes eight unit cell arrays, in order to clarify description. However, the number of unit cell arrays included in each of the first fourth memory banks BK1 to BK4 may be less than or greater than eight. Because each of the first to fourth memory banks BK1 to BK4 includes eight unit cell arrays, five cycles may be used to refresh all of the unit cell arrays of the first to fourth memory banks BK1 to BK4.

During the first cycle, the refresh operation may be performed on the first memory bank BK1 at the first refresh rate, and a first unit cell array M11 of the first memory bank BK1 may be refreshed. During the first cycle, the refresh operation may be performed on the second to fourth memory banks BK2 to BK4 at the second refresh rate, and first unit cell arrays M21, M31, and M41 and fifth unit cell arrays M25, M35, and M45 of the second to fourth memory banks BK2 to BK4 may be refreshed. During the second cycle, the refresh operation may be performed on the second memory bank BK2 at the first refresh rate, and a second unit cell array M22 of the second memory bank BK2 may be refreshed. During the second cycle, the refresh operation may be performed on the first, third, and fourth memory banks BK1, BK3, and BK4 at the second refresh rate, and second unit cell arrays M12, M32, and M42 and sixth unit cell arrays M16, M36, and M46 of the first, third, and fourth memory banks BK1, BK3, and BK4 may be refreshed. During the third cycle, the refresh operation may be performed on the third memory bank BK3 at the first refresh rate, and a third unit cell array M33 of the third memory bank BK3 may be refreshed. During the third cycle, the refresh operation may be performed on the first, second, and fourth memory banks BK1, BK2, and BK4 at the second refresh rate, and third unit cell arrays M13, M23, and M43 and seventh unit cell arrays M17, M27, and M47 of the first, second, and fourth memory banks BK1, BK2, and BK4 may be refreshed. During the fourth cycle, the refresh operation may be performed on the fourth memory bank BK4 at the first refresh rate, and a fourth unit cell array M44 of the fourth memory bank BK4 may be refreshed. During the fourth cycle, the refresh operation may be performed on the first to third memory banks BK1 to BK3 at the second refresh rate, and fourth unit cell arrays M14, M24, and M34 and eighth unit cell arrays M18, M28, and M38 of the first to third memory banks BK1 to BK3 may be refreshed.

According to the result of the refresh operation performed during the first to fourth cycles, a fifth unit cell array M15 of the first memory bank BK1, a sixth unit cell array M26 of the second memory bank BK2, a seventh unit cell array M37 of the third memory bank BK3, and an eighth unit cell array M48 of the fourth memory bank BK4 were not refreshed. The semiconductor memory apparatus may perform an additional refresh operation during an additional cycle, in order to refresh the unit cell arrays on which the refresh operation was not performed while the refresh operation was performed at the first refresh rate in each cycle. During the additional cycle, the semiconductor memory apparatus may refresh the fifth unit cell array M15 of the first memory bank BK1, the sixth unit cell array M26 of the second memory bank BK2, the seventh unit cell array M37 of the third memory bank BK3, and the eighth unit cell array M48 of the fourth memory bank BK4. During the additional cycle, the refresh operation may be performed at the first refresh rate.

FIG. 2C shows a flowchart illustrating the refresh operation of the semiconductor memory apparatus in accordance with the present embodiment. Referring to FIG. 2C with FIGS. 2A and 2B, the first to fourth memory banks BK1 to BK4 may be refreshed through the plurality of cycles, when the refresh operation is started. During the first cycle, the first memory bank BK1 may be refreshed at the first refresh rate, and the other memory banks may be refreshed at the second refresh rate at S21. In the second cycle, the memory bank refreshed at the first refresh rate may be circulated. During the second cycle, the second memory bank BK2 may be refreshed at the first refresh rate, and the other memory banks may be refreshed at the second refresh rate at S22. In the third cycle, the memory bank refreshed at the first refresh rate may be circulated. During the third cycle, the third memory bank BK3 may be refreshed at the first refresh rate, and the other memory banks may be refreshed at the second refresh rate at S23. In the fourth cycle, the memory bank refreshed at the first refresh rate may be circulated. During the fourth cycle, the fourth memory bank BK4 may be refreshed at the first refresh rate, and the other memory banks may be refreshed at the second refresh rate at S24. After S24, the semiconductor memory apparatus may determine whether the refresh operation was performed on the last unit cell array of at least one of the first to fourth memory banks BK1 to BK4 at S25. S21 to S24 may be repeated until the refresh operation is performed on the last unit cell array of at least one of the first to fourth memory banks BK1 to BK4. When the refresh operation for the last unit cell array was not performed, steps S21 to S24 may be repeated. On the other hand, when the refresh operation for the last unit cell array was performed, a refresh operation may be performed in an additional cycle. During the additional cycle, the refresh operation may be additionally performed on the unit cell arrays of the first to fourth memory banks BK1 to BK4, which are not refreshed while the refresh operation is performed at the first refresh rate in each cycle. When the refresh operation is performed during the additional cycle, the refresh operation of the semiconductor memory apparatus may be ended.

Figure 3A:
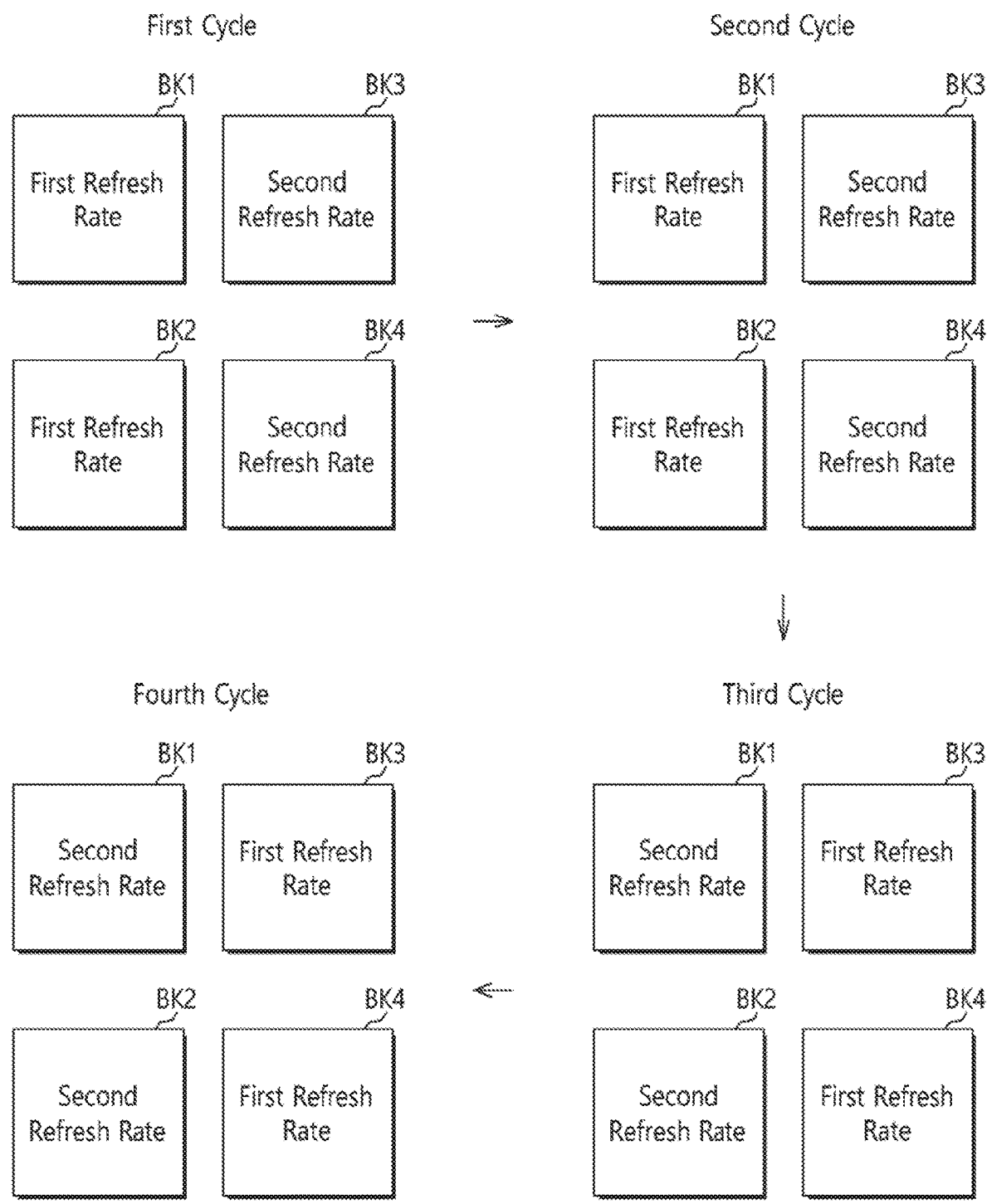
FIGS. 3A, 3B, and 3C illustrate a semiconductor memory apparatus and a refresh method thereof, in accordance with an embodiment.
Figure 3B:
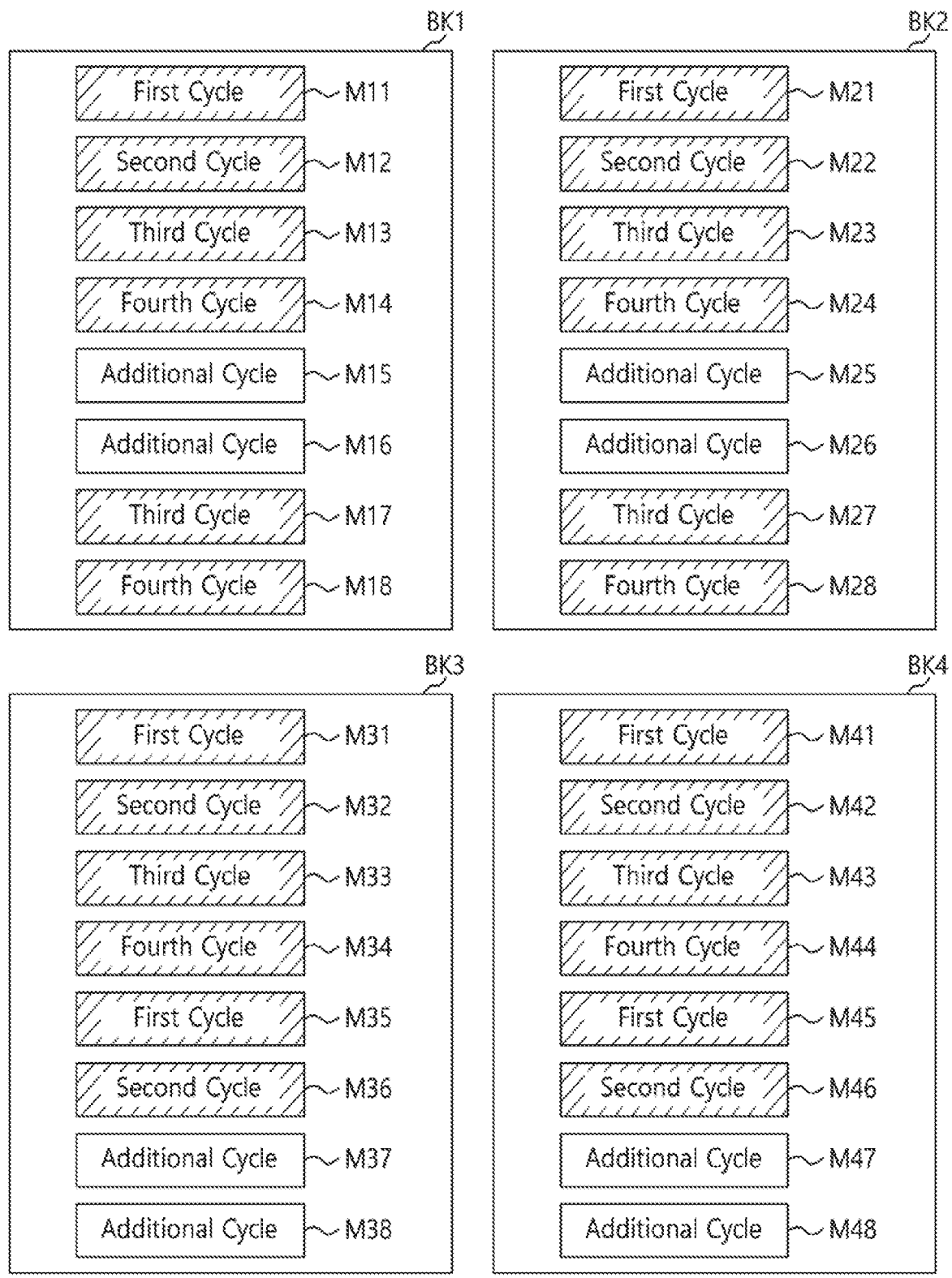
Figure 3C:
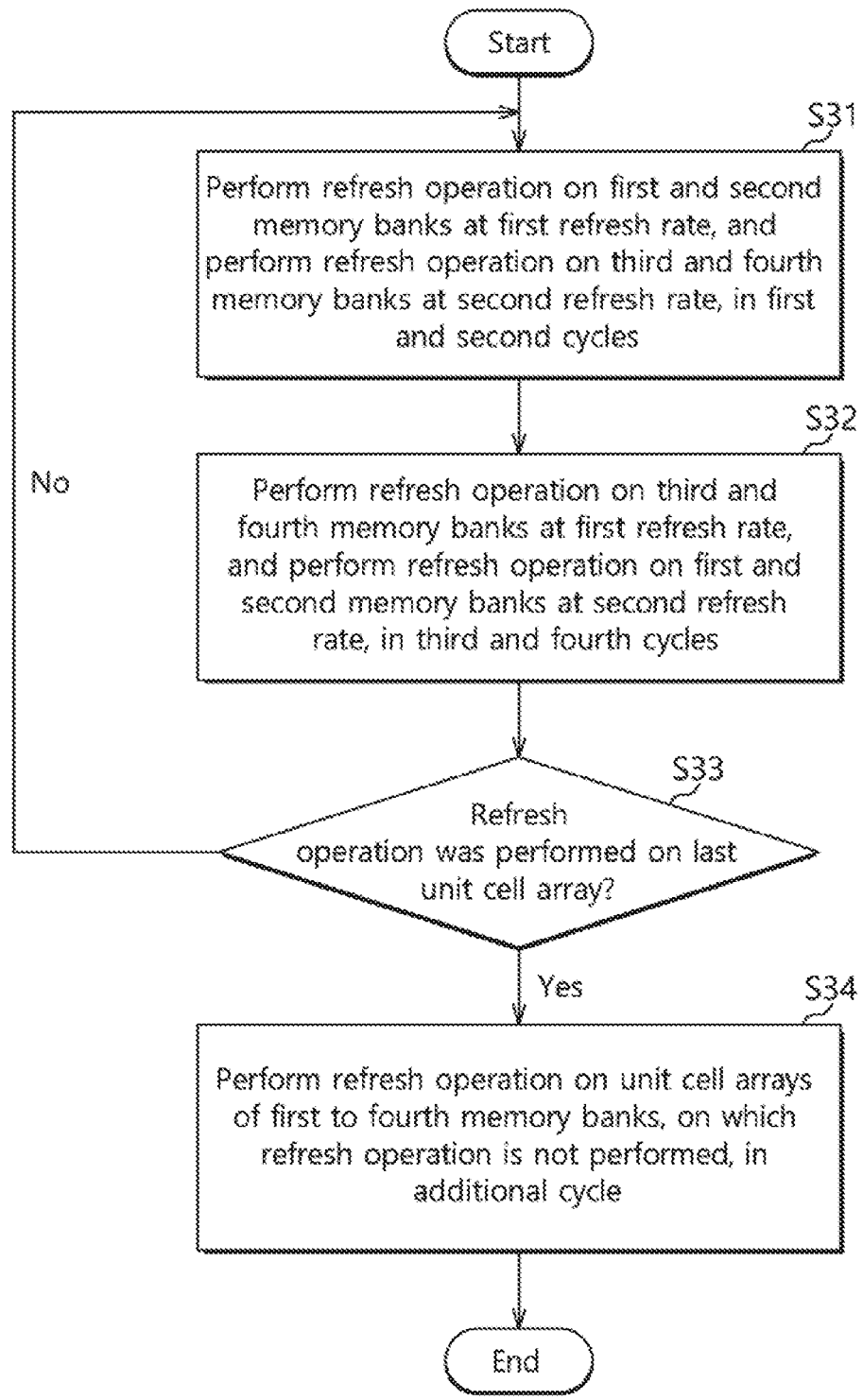

FIGS. 3A, 3B, and 3C illustrate a semiconductor memory apparatus and a refresh method thereof, in accordance with an embodiment. FIG. 3A conceptually illustrates a refresh operation of the semiconductor memory apparatus in accordance with an embodiment. In FIG. 3A, the semiconductor memory apparatus may include a plurality of memory banks. The semiconductor memory apparatus may refresh two or more memory banks of the plurality of memory banks at the first refresh rate, and refresh the other memory banks at the second refresh rate, in each plurality of cycles. The semiconductor memory apparatus may circulate the memory banks refreshed at the first refresh rate in one or two cycles of the plurality of cycles. For example, two memory banks refreshed at the first refresh rate in a first cycle may be refreshed at the second refresh rate in a second cycle. Alternately, two memory banks refreshed at the first refresh rate in the first and second cycles may be refreshed at the second refresh rate in third and fourth cycles.

FIG. 3A illustrates refresh operations which are performed on the first to fourth memory banks BK1 to BK4 during four cycles. During the first cycle, the first and second memory banks BK1 and BK2 may be refreshed at the first refresh rate, and the third and fourth memory banks BK3 and BK4 may be refreshed at the second refresh rate. During the second cycle, the first and second memory banks BK1 and BK2 may be refreshed at the first refresh rate, and the third and fourth memory banks BK3 and BK4 may be refreshed at the second refresh rate. During the third cycle, the third and fourth memory banks BK3 and BK4 may be refreshed at the first refresh rate, and the first and second memory banks BK1 and BK2 may be refreshed at the second refresh rate. During the fourth cycle, the third and fourth memory banks BK3 and BK4 may be refreshed at the first refresh rate, and the first and second memory banks BK1 and BK2 may be refreshed at the second refresh rate. In an embodiment, the memory banks refreshed at the first refresh rate may be circulated in each cycle. For example, the first and second memory banks BK1 and BK2 may be refreshed at the first refresh rate during the first and third cycles, and the third and fourth memory banks BK3 and BK4 may also be refreshed at the first refresh rate during the second and fourth cycles.

FIG. 3B illustrates the configuration of the memory banks of FIG. 3A and the refresh operation in more detail. In FIG. 3B, each of the first to fourth memory banks BK1 to BK4 may include a plurality of unit cell arrays. Each of the first to fourth memory banks may include 2n unit cell arrays, for example. Here, n may be an integer equal to or more than 2. In order to refresh all of the unit cell arrays of the first to fourth memory banks BK1 to BK4, the refresh operation may be performed during (n+1) cycles. Each of the first to fourth memory banks BK1 to BK4 may include eight unit cell arrays. FIG. 3B illustrates that each of the first to fourth memory banks BK1 to BK4 includes eight unit cell arrays, in order to clarify description. However, the number of unit cell arrays included in each of the first to fourth memory banks BK1 to BK4 may be less than or greater than eight. Because each of the first to fourth memory banks BK1 to BK4 includes eight unit cell arrays, five cycles may be used to refresh all of the unit cell arrays of the first to fourth memory banks BK1 to BK4.

During the first cycle, the refresh operation may be performed on the first and second memory banks BK1 and BK2 at the first refresh rate, and first unit cell arrays M11 and M21 of the first and second memory banks BK1 and BK2 may be refreshed. During the first cycle, the refresh operation may be performed on the third and fourth memory banks BK3 and BK4 at the second refresh rate, and first unit cell arrays M31 and M41 and fifth unit cell arrays M35 and M45 of the third and fourth memory banks BK3 and BK4 may be refreshed. During the second cycle, the refresh operation may be performed on the first and second memory banks BK1 and BK2 at the first refresh rate, and second unit cell arrays M12 and M22 of the first and second memory banks BK1 and BK2 may be refreshed. During the second cycle, the refresh operation may be performed on the third and fourth memory banks BK3 and BK4 at the second refresh rate, and second unit cell arrays M32 and M42 and sixth unit cell arrays M36 and M46 of the third and fourth memory banks BK3 and BK4 may be refreshed. During the third cycle, the refresh operation may be performed on the third and fourth memory banks BK3 and BK4 may be refreshed at the first refresh rate, and third unit cell arrays M33 and M43 of the third and fourth memory banks BK3 and BK4 may be refreshed. During the third cycle, the refresh operation may be performed on the first and second memory banks BK1 and BK2 at the second refresh rate, and third unit cell arrays M13 and M23 and seventh unit cell arrays M17 and M27 of the first and second memory banks BK1 and BK2 may be refreshed. During the fourth cycle, the refresh operation may be performed on the third and fourth memory banks BK3 and BK4 at the first refresh rate, and fourth unit cell arrays M34 and M44 of the third and fourth memory banks BK3 and BK4 may be refreshed. During the fourth cycle, the refresh operation may be performed on the first and second memory banks BK1 and BK2 at the second refresh rate, and fourth unit cell arrays M14 and M24 and eighth unit cell arrays M18 and M28 of the first and second memory banks BK1 and BK2 may be refreshed.

According to the result of the refresh operation performed during the first to fourth cycles, fifth and sixth unit cell arrays M15, M16, M25, and M26 of the first and second memory banks BK1 and BK2 and seventh and eighth unit cell arrays M37, M38, M47, and M48 of the third and fourth memory banks BK3 and BK4 were not refreshed. The semiconductor memory apparatus may perform an additional refresh operation during an additional cycle, in order to refresh the unit cell arrays on which the refresh operation was not performed while the refresh operation was performed at the first refresh rate in each cycle. During the additional cycle, the semiconductor memory apparatus may perform the refresh operation on the fifth and sixth unit cell arrays M15, M16, M25, and M26 of the first and second memory banks BK1 and BK2 and the seventh and eighth unit cell arrays M37, M38, M47, and M48 of the third and fourth memory banks BK3 and BK4. During the additional cycle, the refresh operation may be performed at the first refresh rate. For example, the additional cycle includes two cycles. During the first cycle, the fifth unit cell arrays M15 and M25 of the first and second memory banks BK1 and BK2 and the seventh unit cell arrays M37 and M47 of the third and fourth banks BK3 and BK4 may be refreshed. And during the second cycle, the sixth unit cell arrays M16 and M26 of the first and second memory banks BK1 and BK2 and the eighth unit cell arrays M38 and M48 of the third and fourth memory banks BK3 and BK4 may be refreshed. In some embodiments, during the additional cycle, the refresh operation may be performed at the second refresh rate. For example, the additional cycle includes one cycle. During the cycle, the fifth and sixth unit cell arrays M15, M16, M25, and M26 of the first and second memory banks BK1 and BK2 and the seventh and eighth unit cell arrays M37, M38, M47, and M48 of the third and fourth memory banks BK3 and BK4 may be refreshed.

FIG. 3C shows a flowchart illustrating the refresh operation of the semiconductor memory apparatus in accordance with the present embodiment. Referring to FIG. 3C with FIGS. 3A and 3B, the first to fourth memory banks BK1 to BK4 may be refreshed through the plurality of cycles, when the refresh operation is started. During the first and second cycles, the first and second memory banks BK1 and BK2 may be refreshed at the first refresh rate, and the other memory banks may be refreshed at the second refresh rate, at S31. In the third and fourth cycles, the memory banks refreshed at the first refresh rate may be circulated. During the third and fourth cycles, the third and fourth memory banks BK3 and BK4 may be refreshed at the first refresh rate, and the other memory banks may be refreshed at the second refresh rate, at S32. After S32, the semiconductor memory apparatus may determine whether the refresh operation was performed on the last unit cell array of at least one of the first to fourth memory banks BK1 to BK4, at S33. S31 and S32 may be repeated until the refresh operation is performed on the last unit cell array of at least one of the first to fourth memory banks BK1 to BK4. When the refresh operation was not performed on the last unit cell array, S31 and S32 may be repeated. On the other hand, when the refresh operation was performed on the last unit cell array, a refresh operation may be performed in an additional cycle. During the additional cycle, the refresh operation may be additionally performed on the unit cell arrays of the first to fourth memory banks BK1 to BK4, which were not refreshed while the refresh operation was performed at the first refresh rate in each cycle, at S34. When the refresh operation is performed during the additional cycle, the refresh operation of the semiconductor memory apparatus may be ended. In an embodiment, two memory banks refreshed at the first refresh rate may be circulated in each cycle.

Figure 4:
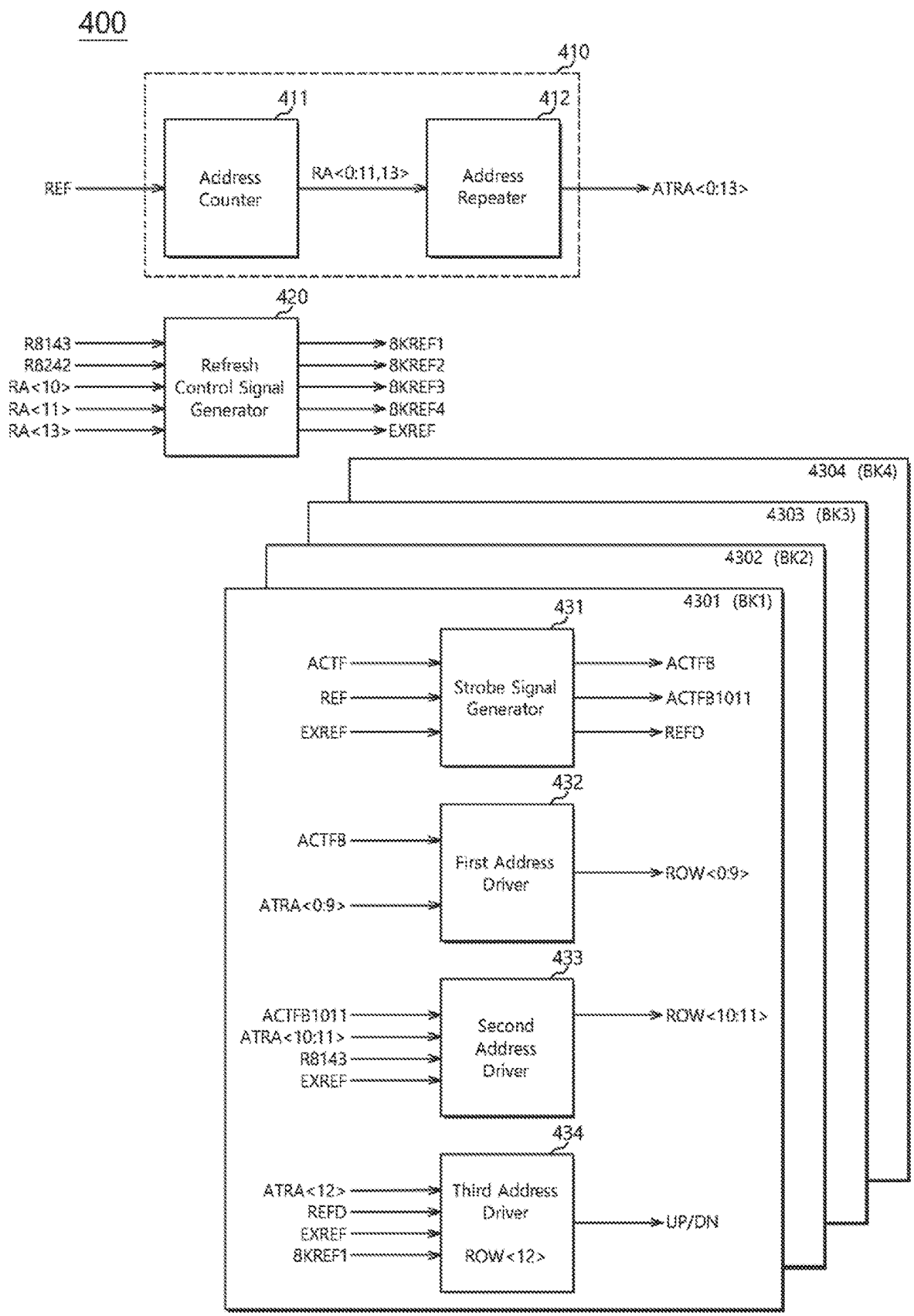
FIG. 4 illustrates a configuration of a semiconductor memory apparatus, in accordance with an embodiment.

FIG. 4 illustrates a configuration of a refresh control circuit 400 in accordance with an embodiment. The refresh control circuit 400 may be applied as the refresh control circuit 122 illustrated in FIG. 1. In FIG. 4, the refresh control circuit 400 may include an address generator 410, a refresh control signal generator 420, and a plurality of address mappers 4301, 4302, 4303, and 4304. The address generator 410 and the refresh control signal generator 420 may be used in common, and the address mappers 4301 to 4304 may be separately provided for the respective memory banks BK1 to BK4. FIG. 4 illustrates that the address mappers 4301 to 4304 provided for the respective memory banks BK1 to BK4 are separated from the address generator 410 and the refresh control signal generator 420. The address generator 410 may receive a refresh signal REF and generate an address signal ATRA<0:13>. The refresh signal REF for controlling the semiconductor memory apparatus to perform a refresh operation may be generated based on the command signal CMD transferred from the first semiconductor apparatus 110 illustrated in FIG. 1, and internally generated by the second semiconductor apparatus 120. The refresh signal REF may be a clock signal which periodically toggles during the refresh operation. The address generator 410 may generate address information RA<0:11, 13> based on the refresh signal REF, and generate the address signal ATRA<0:13> based on the address information RA<0:11, 13>.

The refresh control signal generator 420 may receive refresh mode signals R8143 and R8242 and at least a part of the address information RA<0:11, 13>, and generate refresh control signals 8KREF1, 8KREF2, 8KREF3, and 8KREF4 and an additional refresh signal EXREF. The refresh control signal generator 420 may generate the refresh control signals 8KREF1, 8KREF2, 8KREF3, and 8KREF4 and the additional refresh signal EXREF based on the refresh mode signals R8143 and 88242 and at least the part of the address information RA<0:11, 13>. The refresh mode signals 88143 and R8242 may be used to designate a refresh mode performed by the semiconductor memory apparatus. The semiconductor memory apparatus may perform the refresh operation in one mode of first and second refresh modes. For example, the refresh operation performed in the first refresh mode may correspond to the refresh operation illustrated in FIGS. 2A to 2C, and the refresh operation performed in the second refresh mode may correspond to the refresh operation illustrated in FIGS. 3A to 3C. The refresh mode signal may include a first refresh mode signal R8143 and a second refresh mode signal R8242. The first refresh mode signal 88143 may be enabled to perform the refresh operation in the first refresh mode. The second refresh mode signal 88242 may be enabled to perform the refresh operation in the second refresh mode. The refresh control signal generator 420 may receive at least some bits of the address information RA<0:11, 13>. For example, the refresh control signal generator 420 may receive an 11th bit RA<10>, a 12th bit RA<11> and a 14th bit RA<13> of the address information.

The refresh control signal generator 420 may generate the refresh control signals 8KREF1, 8KREF2, 8KREF3, and 8KREF4 based on the values of the 11th bit RA<10> and the 12th bit RA<11> of the address information in the first refresh mode. The refresh control signal may include the first to fourth refresh control signals 8KREF1, 8KREF2, 8KREF3, and 8KREF4. The first refresh control signal 8KREF1 may be a control signal related to the first memory bank BK1, the second refresh control signal 8KREF2 may be a control signal related to the second memory bank BK2, the third refresh control signal 8KREF3 may be a control signal related to the third memory bank BK3, and the fourth refresh control signal 8KREF4 may be a control signal related to the fourth memory bank BK4. Each of the refresh control signals 8KREF1, 8KREF2, 8KREF3, and 8KREF4 may be used to control a memory bank to perform a refresh operation at the first refresh rate, the memory bank receiving the refresh control signal. For example, when the first refresh control signal 8KREF1 is enabled, the first memory bank BK1 receiving the first refresh control signal 8KREF1 may perform the refresh operation at the first refresh rate. On the other hand, when the first refresh control signal 8KREF1 is disabled, the first memory bank BK1 receiving the first refresh control signal 8KREF1 may perform the refresh operation at the second refresh rate. In the first refresh mode, one memory bank may perform the refresh operation at the first refresh rate, and the other memory banks may perform the refresh operation at the second refresh rate. Thus, the refresh control signal generator 420 may enable one of the first to fourth refresh control signals 8KREF1, 8KREF2, 8KREF3, and 8KREF4, using two bits RA<10> and RA<11> of the address information RA<0:11, 13>.

The refresh control signal generator 420 may generate the refresh control signals 8KREF1, 8KREF2, 8KREF3, and 8KREF4 based on the value of the 12th bit RA<11> of the address information in the second refresh mode. In the second refresh mode, two memory banks may perform the refresh operation at the first refresh rate, and the other two memory banks may perform the refresh operation at the second refresh rate. Thus, the refresh control signal generator 420 may enable two of the first to fourth refresh control signals 8KREF1, 8KREF2, 8KREF3, and 8KREF4, using one bit RA<11> of the address information RA<0:11, 13>.

The refresh control signal generator 420 may generate the additional refresh signal EXREF based on the 14th bit RA<13> of the address information RA<0:11, 13>. The address generator 410 may generate the address signal ATRA<0:13> corresponding to the unit cell arrays of the first to fourth memory banks BK1 to BK4 by increasing the value of the address information RA<0:11, 13>. The logic value of the 14th bit RA<13> of the address information RA<0:11, 13> may be changed when the value of the address information RA<0:11> is counted as the maximum value, that is, when the refresh operation is performed on the last unit cell array of any one of the first to fourth memory banks BK1 to BK4. When the logic value of the 14th bit RA<13> of the address information is changed, the refresh control signal generator 420 may enable the additional refresh signal EXREF to perform an additional refresh operation during the additional cycle.

The address mappers 4301 to 4304 may receive the refresh signal REF, the refresh mode signals R8143 and R8242, the address signal ATRA<0:13>, the refresh control signals 8KREF1, 8KREF2, 8KREF3, and 8KREF4, and the additional refresh signal EXREF, and generate a row address signal. The number of the address mappers 4301 to 4304 may correspond to the number of the memory banks. FIG. 4 illustrates the configuration of the address mapper 4301 for generating the row address signal for the first memory bank BK1. The address mappers 4302 to 4304 for generating row address signals for the second to fourth memory banks BK2 to BK4 may have the same configuration as the address mapper 4301 except that the received signals are partially different.

The address mapper 4301 may generate first to tenth bits ROW<0:9> of the row address signal based on first to tenth bits ATRA<0:9> of the address signal. The first to tenth bits ROW<0:9> of the row address signal may be used to select a word line positioned in a selected unit cell array of the first memory bank BK1. The address mapper 4301 may generate 11th and 12th bits ROW<10:11> of the row address signal based on at least a part of the refresh mode signals 88143 and 88242, the assigned refresh control signal, the additional refresh signal EXREF, and the 11th and 12th bits ATRA<10:11> of the address signal. The address mapper 4301 may generate the 11th and 12th bits ROW<10:11> of the row address signal based on the first refresh mode signal 88143, the first refresh control signal 8KREF1, the additional refresh signal EXREF and the 11th and 12th bits ATRA<10:11> of the address signal. The address mapper 4301 may generate a 13th bit ROW<12> of the row address signal based on the 13th bit ATRA<12> of the address signal and the additional refresh signal EXREF, and generate an up signal UP and a down signal DN based on the 13th bit ROW<12> of the row address signal.

In an embodiment, the 13th bit ROW<12> of the row address signal may have information capable of selecting half of the plurality of unit cell arrays included in the memory bank. For example, when the 13th bit ROW<12> has a logic low level, the upper half of the plurality of unit cell arrays may be selected, and when the 13th bit ROW<12> has a logic high level, the lower half of the plurality of unit cell arrays may be selected. Referring to FIG. 4 with FIG. 2B, the first to fourth unit cell arrays M11 to M14 of the first to eighth unit cell arrays M11 to M18 may be selected when the 13th bit ROW<12> has a logic low level, and the fifth to eighth unit cell arrays M15 to M18 of the first to eighth unit cell arrays M11 to M18 may be selected when the 13th bit ROW<12> has a logic high level. The up signal UP which is generated based on the 13th bit ROW<12> may be used to select the first to fourth unit cell arrays M11 to M14, and the down signal DN may be used to select the fifth to eighth unit cell arrays M15 to M18.

The 12th bit ROW<11> of the row address signal may be used to select a half of the selected half of the unit cell arrays based on the 13th bit ROW<12>. For example, when the first to fourth unit cell arrays M11 to M14 are selected based on the 13th bit ROW<12>, the first and second unit cell arrays M11 and M12 or the third and fourth unit cell arrays M13 and M14 may be selected based on the 12th bit ROW<11>. The 11th bit ROW<10> of the row address signal may be used to select a half of the selected half of the unit cell arrays based on the 12th bit ROW<11>. For example, when the first and second unit cell arrays M11 and M12 are selected based on the 13th and 12th bits ROW<12> and ROW<11>, one of the first and second unit cell arrays M11 and M12 may be selected based on the 11th bit ROW<10>. Therefore, the address mapper 4301 may select one or two unit cell arrays by changing the logic values of the 11th to 13th bits ROW<10:12> of the row address signal, in order to perform the refresh operation.

In FIG. 4, the address generator 410 may include an address counter 411 and an address repeater 412. The address counter 411 may generate the address information RA<0:11, 13> based on the refresh signal REF. The address counter 411 may sequentially increase the value of the address information RA<0:11, 13> by performing a counting operation whenever the refresh signal REF toggles. The address counter 411 may count the first to 12th bits RA<0:11> and the 14th bit RA<13> of the address information. While the first to tenth bits RA<0:9> are counted from the minimum value to the maximum value, one cycle may be performed. During one cycle, the refresh operation may be performed. That is, while the value of the first to tenth bits RA<0:9> is increased, all word lines of one unit cell array may be sequentially activated. The 11th bit RA<10> may have a logic value that is changed whenever the first to tenth bits RA<0:9> are counted as the maximum value, and the 12th bit RA<11> may have a logic value that is changed whenever the first to 11th bits RA<0:10> are counted as the maximum value. The 14th bit RA<13> may have a logic value that is changed whenever the first to 12th bits RA<0:11> are all counted as the maximum values.

The address repeater 412 may generate the address signal ATRA<0:13> based on the address information RA<0:11, 13>. The address repeater 412 may generate the address signal ATRA<0:13> by repeating the address information RA<0:11, 13>. The address repeater 412 may generate the first to 12th bits ATRA<0:11> and the 14th bit ATRA<13> of the address signal by repeating the first to 12th bits RA<0:11> and the 14th bit RA<13> of the address information. The address repeater 412 may generate the 13th bit ATRA<12> of the address signal, having any one fixed logic value. For example, the address repeater 412 may fix the logic level of the 13th bit ATRA<12> of the address signal to a logic low level.

In FIG. 4, the address mapper 4301 may include a strobe signal generator 431, a first address driver 432, a second address driver 433, and a third address driver 434. The strobe signal generator 431 may receive an active pulse ACTF, the refresh signal REF, and the additional refresh signal EXREF, and generate a first strobe signal ACTFB, a second strobe signal ACTFB1011, and a third strobe signal REFD. The active pulse ACTF may be a row address strobe signal which periodically toggles in the same manner as the refresh signal REF. The strobe signal generator 431 may generate the first strobe signal ACTFB and the second strobe signal ACTFB1011 based on the active pulse ACTF and the additional refresh signal EXREF, and may generate the third strobe signal REFD based on the refresh signal REF.

The first address driver 432 may receive the first strobe signal ACTFB and at least a part of the address signal ATRA<0:13>, and generate at least a part of the row address signal ROW<0:13>. The first address driver 432 may generate at least a part of the row address signal ROW<0:13> by strobing at least a part of the address signal ATRA<0:13> with the first strobe signal ACTFB. The first address driver 432 may strobe the first to tenth bits ATRA<0:9> of the address signal with the first strobe signal ACTFB, and provide the strobed bits as the first to tenth bits ROW<0:9> of the row address signal.

The second address driver 433 may receive the second strobe signal ACTFB1011, at least a part of the address signal ATRA<0:13>, at least a part of the refresh mode signals R8143 and R8242, and the additional refresh signal EXREF, and generate at least a part of the row address signal ROW<0:13>. The second address driver 433 may strobe the 11th and 12th bits ATRA<10:11> of the address signal with the second strobe signal ACTFB1011 and output the strobed bits as the 11th and 12th bits ROW<10:11> of the row address signal, and fix the 11th and 12th bits ROW<10:11> of the row address signal to a predetermined logic level based on the first refresh mode signal 88143 and the additional refresh signal EXREF.

The third address driver 434 may receive the third strobe signal REFD, at least a part of the address signal ATRA<0:13>, and the additional refresh signal EXREF, and generate the up signal UP and the down signal DN. The third address driver 434 may generate the 13th bit ROW<12> of the row address signal by strobing one of the 13th bit ATRA<12> of the address signal and a signal having a predetermined logic level with the third strobe signal REED based on the additional refresh signal EXREF. The third address driver 434 may generate the up signal UP and the down signal DN based on the 13th bit ROW<12> of the row address signal and the assigned refresh control signal. The third address driver 434 may generate the up signal UP and the down signal DN based on the 13th bit ROW<12> of the row address signal and the first refresh control signal 8KREF1. The row address signal ROW<0:11>, the up signal UP and the down signal DN may be provided to the row decoder 123 illustrated in FIG. 1. The row decoder 123 may activate word lines of specific unit cell arrays of the plurality of memory banks based on the row address signal ROW<0:11>, the up signal UP and the down signal DN, such that the refresh operation can be performed.

Figure 5:
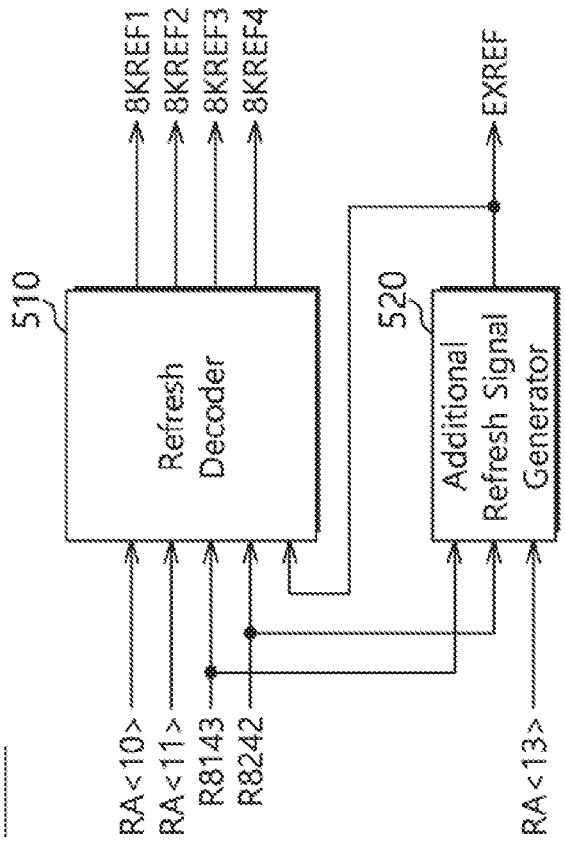
FIG. 5 illustrates a configuration and operation of a refresh control signal generator illustrated in FIG. 4.

FIG. 5 illustrates a configuration and operation of the refresh control signal generator 420 illustrated in FIG. 4. In FIG. 5, the refresh control signal generator 420 may include a refresh decoder 510 and an additional refresh signal generator 520. The refresh decoder 510 may receive the 11th and 12th bits RA<10:11> of the address information and the first and second refresh mode signals R8143 and R8242, and generate the first to fourth refresh control signals 8KREF1, 8KREF2, 8KREF3, and 8KREF4. The refresh decoder 510 may enable one of the first to fourth refresh control signals 8KREF1, 8KREF2, 8KREF3, and 8KREF4 based on the 11th and 12th bits RA<10:11> of the address information, in the first refresh mode. In the first refresh mode, the first refresh mode signal R8143 may be enabled, and the refresh decoder 510 may enable the first refresh control signal 8KREF1 and disable the second to fourth refresh control signals 8KREF2, 8KREF3, and 8KREF4, when the first refresh mode signal R8143 is enabled and the 11th and 12th bits RA<10:11> of the address information are all at a low level. The refresh decoder 510 may enable the second refresh control signal 8KREF2 and disable the first, third, and fourth refresh control signals 8KREF1, 8KREF3, and 8KREF4, when the first refresh mode signal R8143 is enabled, the 11th bit RA<10> of the address information is at a high level, and the 12th bit RA<11> is at a low level. The refresh decoder 510 may enable the third refresh control signal 8KREF3 and disable the first, second, and fourth refresh control signals 8KREF1, 8KREF2, and 8KREF4, when the first refresh mode signal R8143 is enabled, the 11th bit RA<10> of the address information is at a low level, and the 12th bit RA<11> is at a high level. The refresh decoder 510 may enable the fourth refresh control signal 8KREF4 and disable the first third refresh control signals 8KREF1, 8KREF2, and 8KREF3, when the first refresh mode signal 88143 is enabled and the 11th and 12th bits RA<10:11> of the address information are all at a high level.

The refresh decoder 510 may enable two of the first to fourth refresh control signals 8KREF1, 8KREF2, 8KREF3, and 8KREF4 based on the 12th bit RA<11> of the address information in the second refresh mode. In the second refresh mode, the second refresh mode signal R8242 may be enabled, and the refresh decoder 510 may enable the first to fourth refresh control signals 8KREF1, 8KREF2, 8KREF3, and 8KREF4 based on the 12th bit RA<11>, without considering the 11th bit RA<10> of the address information. The refresh decoder 510 may enable the first and second refresh control signals 8KREF1 and 8KREF2 and disable the third and fourth refresh control signals 8KREF3 and 8KREF4, when the second refresh mode signal 88242 is enabled and the 12th bit RA<11> of the address information is at a low level. The refresh decoder 510 may enable the third and fourth refresh control signals 8KREF3 and 8KREF4 and disable the first and second refresh control signals 8KREF1 and 8KREF2, when the second refresh mode signal R8242 is enabled and the 12th bit RA<11> of the address information is at a high level.

The additional refresh signal generator 520 may enable the additional refresh signal EXREF when the logic level of the 14th bit RA<13> of the address information is changed while any one of the first and second refresh mode signals R8143 and R8242 is enabled. For example, the additional refresh signal generator 520 may enable the additional refresh signal EXREF when the 14th bit RA<13> of the address information is counted as a high level while the refresh operation is performed in the first or second refresh mode. The refresh decoder 510 may further receive the additional refresh signal EXREF. The refresh decoder 510 may enable all of the first to fourth refresh control signals 8KREF1, 8KREF2, 8KREF3, and 8KREF4 without considering the 11th and 12th bits RA<10:11> of the address information, when the additional refresh signal EXREF is enabled.

Figure 6:
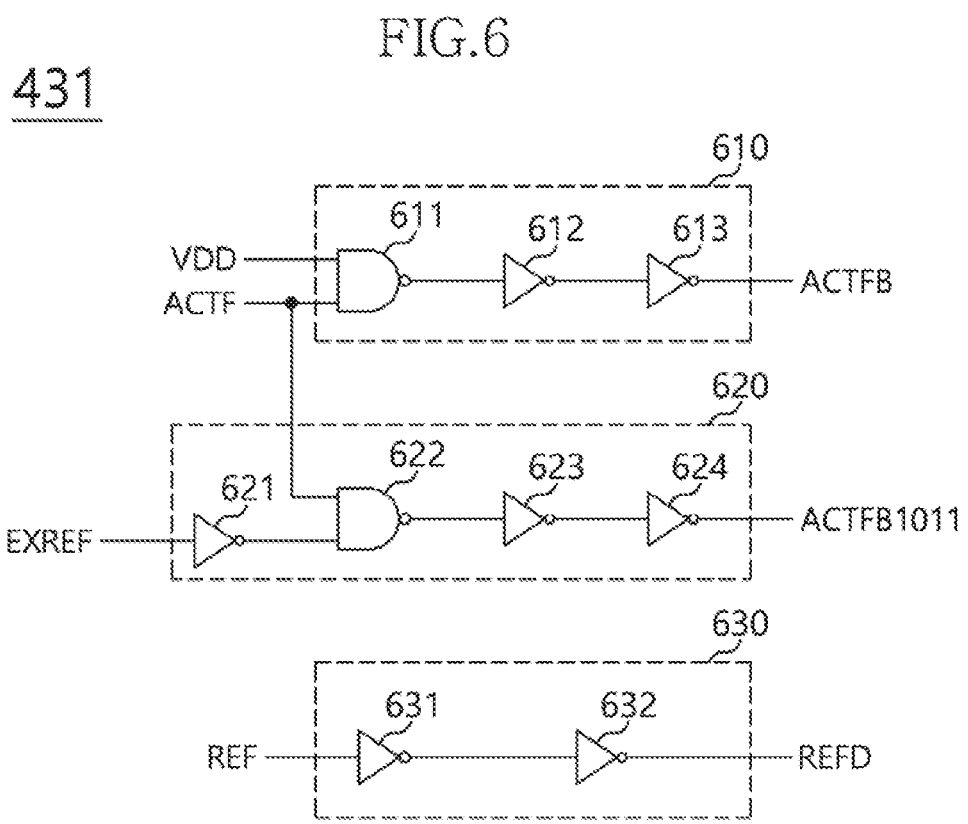
FIG. 6 illustrates a configuration of a strobe signal generator illustrated in FIG. 4.

FIG. 6 illustrates a configuration of the strobe signal generator 431 illustrated in FIG. 4. In FIG. 6, the strobe signal generator 431 may include a first strobe signal generator 610, a second strobe signal generator 620, and a third strobe signal generator 630. The first strobe signal generator 610 may receive the active pulse ACTF, and generate the first strobe signal ACTFB. The first strobe signal generator 610 may generate the first strobe signal ACTFB which is enabled at a low level whenever the active pulse ACTF is enabled. The first strobe signal generator 610 may include a first NAND gate 611, a first inverter 612, and a second inverter 613. The first NAND gate 611 may receive the active pulse ACTF and a supply voltage VDD. The first inverter 612 may invert and output an output of the first NAND gate 611, and the second inverter 613 may invert the output of the first inverter 612, and output the inverted signal as the first strobe signal ACTFB.

The second strobe signal generator 620 may receive the active pulse ACTF and the additional refresh signal EXREF, and generate a second strobe signal ACTF1011. The second strobe signal generator 620 may generate the second strobe signal ACTFB1011 which is enabled at a low level whenever the active pulse ACTF is enabled, when the additional refresh signal EXREF is disabled. The second strobe signal generator 620 may disable the second strobe signal ACTFB1011 at a high level regardless of the active pulse ACTF, when the additional refresh signal EXREF is enabled. The second strobe signal generator 620 may include a third inverter 621, a second NAND gate 622, a fourth inverter 623, and a fifth inverter 624. The third inverter 621 may invert and output the additional refresh signal EXREF. The second NAND gate 622 may receive the active pulse ACTF and the output of the third inverter 621. The fourth and fifth inverters 623 and 624 may sequentially invert an output of the second NAND gate 622, and output the inverted signal as the second strobe signal ACTFB1011.

The third strobe signal generator 630 may receive the refresh signal REF, and generate the third strobe signal REFD. The third strobe signal generator 630 may generate the third strobe signal REFD by buffering the refresh signal REF. The third strobe signal generator 630 may generate the third strobe signal REFD which is enabled at a high level whenever the refresh signal REF is enabled. The third strobe signal generator 630 may include a sixth inverter 631 and a seventh inverter 632. The sixth and seventh inverters 631 and 632 may sequentially invert the refresh signal REF, and output the inverted signal as the third strobe signal REF©.

Figure 7:
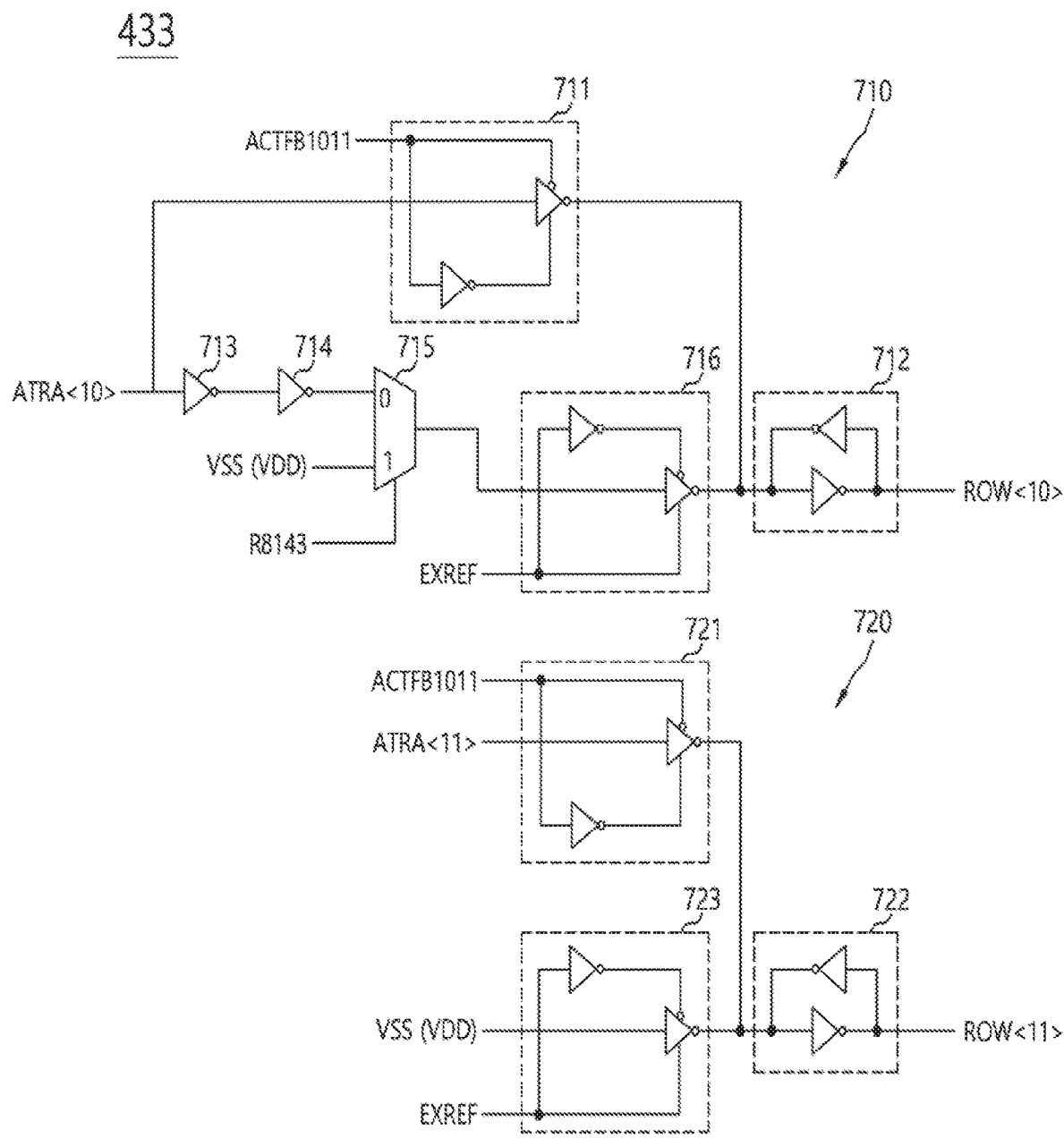
FIG. 7 illustrates a configuration of a second address driver illustrated in FIG. 4.

FIG. 7 illustrates a configuration of the second address driver 433 illustrated in FIG. 4. In FIG. 7, the second address driver 433 may include a first driver 710 and a second driver 720. The first driver 710 may receive the 11th bit ATRA<10> of the address signal, the second strobe signal ACTFB1011, the first refresh mode signal R8143 and the additional refresh signal EXREF. The first driver 710 may strobe the 11th bit ATRA<10> of the address signal with the second strobe signal ACTFB1011, and output the strobed bit as the 11th bit ROW<10> of the row address signal. The first driver 710 may fix the 11th bit ROW<10> of the row address signal to a predetermined voltage level when the additional refresh signal EXREF is enabled in the first refresh mode, and output the 11th bit ATRA<10> of the address signal as the 11th bit ROW<10> of the row address signal when the additional refresh signal EXREF is enabled in the second refresh mode.

The word "predetermined" as used herein with respect to a parameter, such as a predetermined voltage level or a predetermined logic level, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The first driver 710 may include a first driving inverter 711, a first latch 712, a first inverter 713, a second inverter 714, a first multiplexer 715, and a second driving inverter 716. The first driving inverter 711 may invert and output the 11th bit ATRA<10> of the address signal when the second strobe signal ACTFB1011 is enabled at a low level. The first latch 712 may generate the 11th bit ROW<10> of the row address signal by inverting outputs of the first and second driving inverters 711 and 716, and retain the logic level of the 11th bit ROW<10>. The first and second inverters 713 and 714 may sequentially invert the 11th bit ATRA<10> of the address signal. The first multiplexer 715 may output the output of the second inverter 714 when the first refresh mode signal 88143 is disabled, and output the predetermined voltage level when the first refresh mode signal R8143 is enabled. For example, the predetermined voltage may be a ground voltage VSS. The second address driver of the address mapper related to the third memory bank BK3 may receive the ground voltage VSS like the first driver 710 of the second address driver 433. The second address drivers of the address mappers related to the second and fourth memory banks BK2 and BK4 may receive the supply voltage VDD instead of the ground voltage VSS. The second driving inverter 716 may invert and output an output of the first multiplexer 715 when the additional refresh signal EXREF is enabled at a high level. When an additional refresh operation is performed in an additional cycle, the first memory bank BK1 needs to perform the refresh operation on a unit cell array which is not refreshed, while performing the refresh operation at the first refresh rate. Thus, the first driver 710 may fix the logic level of the 11th bit ROW<10> of the row address signal to a low level when the additional refresh signal EXREF is enabled.

The second driver 720 may receive the 12th bit ATRA<11> of the address signal, the second strobe signal ACTFB1011, and the additional refresh signal EXREF. The second driver 720 may strobe the 12th bit ATRA<11> of the address signal with the second strobe signal ACTFB1011, and output the strobed bit as the 12th bit ROW<11> of the row address signal. The second driver 720 may fix the 12th bit ROW<11> of the row address signal to a predetermined level when the additional refresh signal EXREF is enabled.

The second driver 720 may include a third driving inverter 721, a second latch 722, and a fourth driving inverter 723. The third driving inverter 721 may invert and output the 12th bit ATRA<11> of the address signal when the second strobe signal ACTFB1011 is enabled at a low level. The second latch 722 may generate the 12th bit ROW<11> of the row address signal by inverting outputs of the third and fourth driving inverters 721 and 723, and retain the logic level of the 12th bit ROW<11>. The fourth driving inverter 723 may invert and output a predetermined voltage level, when the additional refresh signal EXREF is enabled at a high level. The predetermined voltage may be the ground voltage VSS. The second address driver of the address mapper related to the second memory bank may receive the ground voltage VSS like the second driver 720 of the second address driver 433. The second address drivers of the address mappers related to the third and fourth memory banks BK3 and BK4 may receive the supply voltage VDD instead of the ground voltage VSS. When the additional refresh operation is performed in the additional cycle, the first memory bank BK1 performs the refresh operation on a unit cell array which is not refreshed, while performing the refresh operation at the first refresh rate. Thus, the second driver 720 may fix the logic level of the 12th bit ROW<11> of the row address signal to a low level when the additional refresh signal EXREF is enabled.

Figure 8:
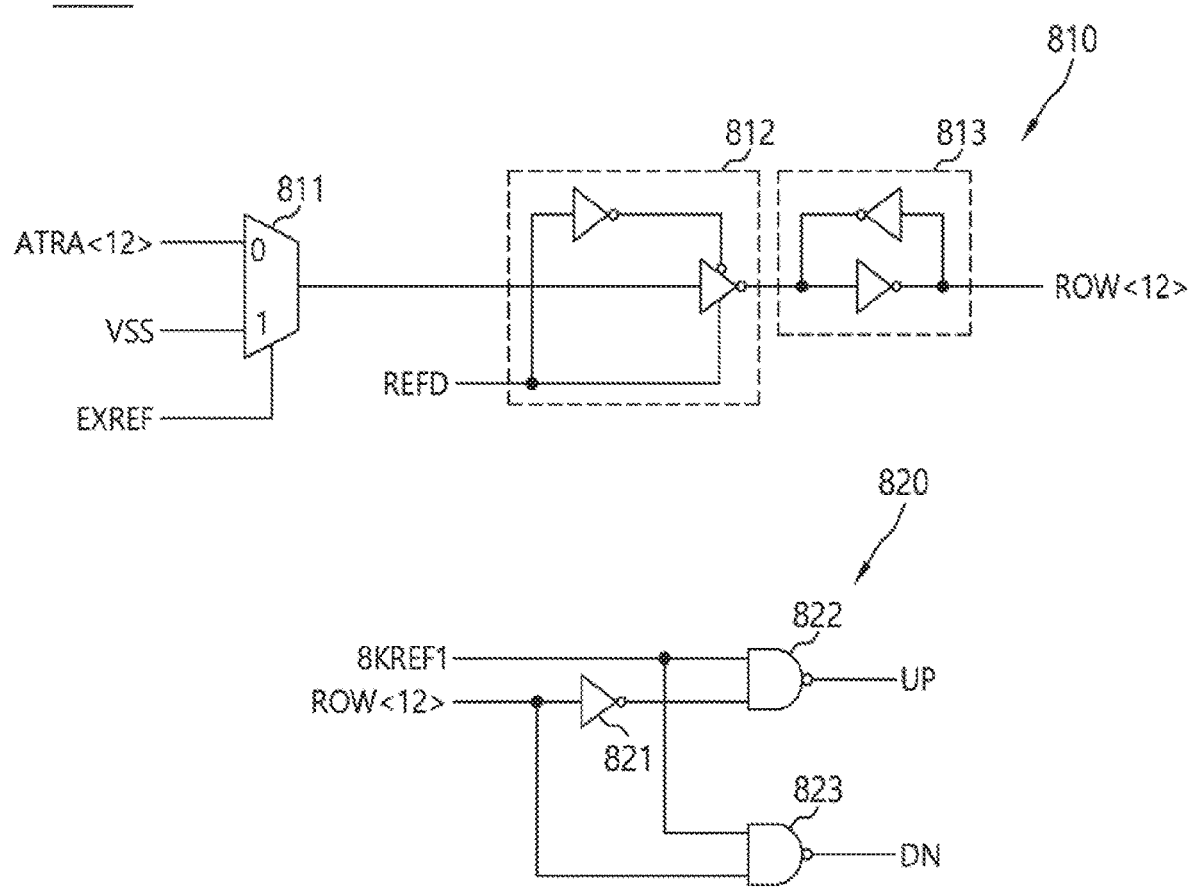
FIG. 8 illustrates a configuration of a third address driver illustrated in FIG. 4.

FIG. 8 illustrates a configuration of the third address driver 434 illustrated in FIG. 4. In FIG. 8, the third address driver 434 may include a third driver 810 and an up/down selector 820. The third driver 810 may receive the additional refresh signal EXREF, the 13th bit ATRA<12> of the address signal, and the third strobe signal REFD. The third driver 810 may strobe the 13th bit ATRA<12> of the address signal with the third strobe signal REFD, and output the strobed bit as the 13th bit ROW<12> of the row address signal, when the additional refresh signal EXREF is disabled. The third driver 810 may strobe the predetermined voltage level with the third strobe signal REFD, and output the strobed bit as the 13th bit ROW<12> of the row address signal, when the additional refresh signal EXREF is enabled. The predetermined voltage may be the ground voltage VSS.

The third driver 810 may include a multiplexer 811, a driving inverter 812, and a latch 813. The multiplexer 811 may output one of the 13th bit ATRA<12> of the address signal and the ground voltage VSS, based on the additional refresh signal EXREF. The multiplexer 811 may output the 13th bit ATRA<12> of the address signal when the additional refresh signal EXREF is disabled, and output the ground voltage VSS when the additional refresh signal EXREF is enabled. The driving inverter 812 may invert and output the output of the multiplexer 811 when the third strobe signal REFD is enabled. The latch 813 may invert the output of the driving inverter 812 and output the inverted signal as the 13th bit ROW<12> of the row address signal, and retain the logic level of the row address signal ROW<12>.

The up/down selector 820 may receive the 13th bit ROW<12> of the row address signal and the first refresh control signal 8KREF1. The up/down selector 820 may enable both of the up signal UP and the down signal DN regardless of the 13th bit ROW<12> of the row address signal, when the first refresh control signal 8KREF1 is disabled. The up/down selector 820 may enable the up signal UP and disable the down signal DN, when the first refresh control signal 8KREF1 is enabled and the 13th bit ROW<12> of the row address signal is at a high level. The up/down selector 820 may disable the up signal UP and enable the down signal DN, when the first refresh control signal 8KREF1 is enabled and the 13th bit ROW<12> of the row address signal is at a low level.

The up/down selector 820 may include an inverter 821, a first NAND gate 822, and a second NAND gate 823. The inverter 821 may invert and output the 13th bit ROW<12> of the row address signal. The first NAND gate 822 may receive the first refresh control signal 8KREF1 and the output of the inverter 821, and generate the up signal UP. The second NAND gate 823 may receive the first refresh control signal 8KREF1 and the 13th bit ROW<12> of the row address signal, and generate the down signal DN. The up/down selector 820 may enable both of the up signal UP and the down signal DN at a high level, when the first refresh control signal 8KREF1 is disabled at a low level. The up/down selector 820 may enable the up signal UP at a high level and disable the down signal DN at a low level, when the first refresh control signal 8KREF1 is enabled at a high level and the 13th bit ROW<12> of the row address signal is at a high level. The up/down selector 820 may disable the up signal UP at a low level and enable the down signal DN at a high level, when the first refresh control signal 8KREF1 is enabled at a high level and the 13th bit ROW<12> of the row address signal is at a low level.

Figure 9:
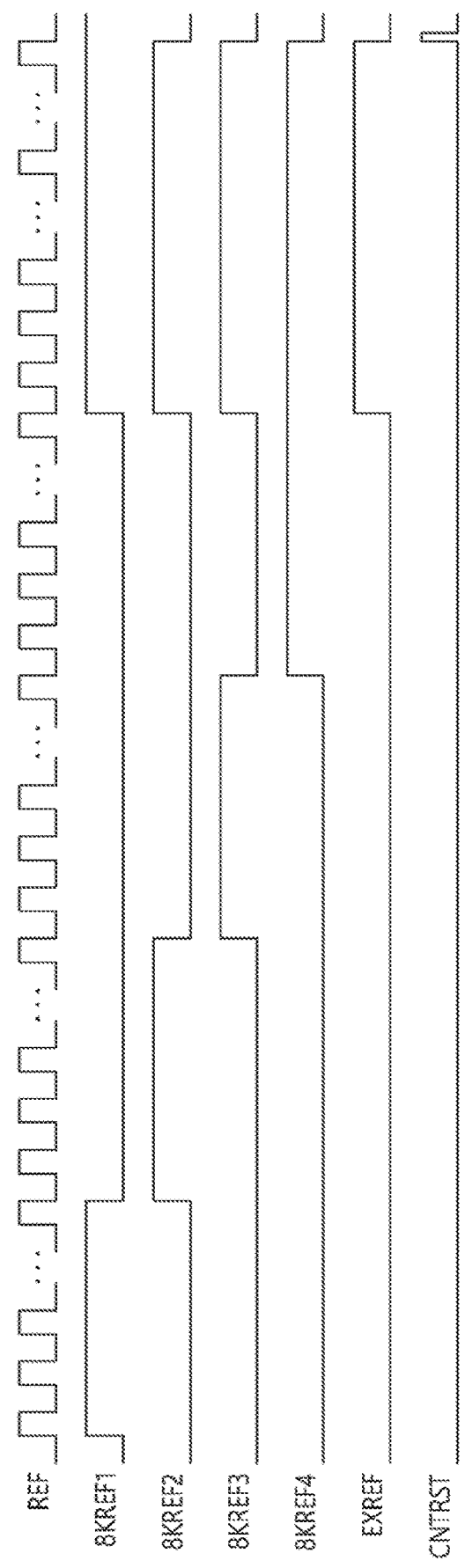
FIG. 9 shows a timing diagram illustrating an operation of a semiconductor memory apparatus, in accordance with the present embodiment, in a first refresh mode.

FIG. 9 shows a timing diagram illustrating the operation of the semiconductor memory apparatus, in accordance with an embodiment, in the first refresh mode. Referring to FIGS. 1 to 9, the operation of the semiconductor memory apparatus is described as follows. When a refresh operation is performed, the refresh signal REF may continuously toggle, and the address counter 411 may sequentially increase the value of the address information RA<0:11, 13> whenever the refresh signal REF toggles. In the first refresh mode, the first refresh mode signal 88143 may be enabled, and the second refresh mode signal R8242 may be disabled. Because the 11th and 12th bits RA<10:11> of the address information are at a low level in the first cycle, the refresh control signal generator 420 may enable the first refresh control signal 8KREF1, and disable the second to fourth refresh control signals 8KREF2, 8KREF3, and 8KREF4. Because the 14th bit RA<13> of the address information retains a low level, the additional refresh signal EXREF may also retain a disabled state. The address repeater 412 may output the 13th bit ATRA<12> of the address signal, which has a high level. The third driver 810 of the third address driver 434 may generate the 13th bit ROW<12> of the row address signal by strobing the high-level 13th bit ATRA<12> of the address signal with the third strobe signal REFD, the up/down selector 820 may enable the up signal UP, and the row decoder 123 may select the upper unit cell arrays of the first memory bank BK1 based on the up signal UP. That is, the row decoder 123 may select the first to fourth unit cell arrays M11 to M14 among the first to eighth unit cell arrays M11 to M18 of the first memory bank BK1 illustrated in FIG. 2B. The second address driver 433 may generate the 11th and 12th bits ROW<10:11> of the row address signal by strobing the low-level 11th and 12th bits ATRA<10:11> of the address signal with the second strobe signal ACTFB1011. Therefore, the row decoder 123 may select the first unit cell array M11 of the first to fourth unit cell arrays M11 to M14 based on the 11th and 12th bits ROW<10:11> of the row address signal. The first address driver 432 may generate the first to tenth bits ROW<0:9> of the row address signal by strobing the first to tenth bits ATRA<0:9> of the address signal with the first strobe signal ACTFB. The first address driver 432 may sequentially increase the value of the row address signal ROW<0:9> when the address signal ATRA<0:9> is counted, and the row decoder 123 may perform the refresh operation on the first unit cell array M11 by sequentially enabling the word lines of the selected first unit cell array M11.

Because the second to fourth refresh control signals 8KREF2 to 8KREF4 are disabled during the first cycle, the up signals and the to down signals of the second to fourth memory banks BK2 to BK4 may be all enabled. Because the 11th and 12th bits ROW<10:11> of the row address signal are all at a low level, the row decoder 123 may select the first unit cell arrays M21, M31, and M41 and the fifth unit cell arrays M25, M35, and M45 of the second to fourth memory banks BK2 to BK4. When the value of the first to tenth bits ROW<0:9> of the row address signal is sequentially increased, the row decoder 123 may perform the refresh operation on the first and fifth unit cell arrays M21, M25, M31, M35, M41, and M45 of the second to fourth memory banks BK2 to BK4 by sequentially enabling the word lines of the first and fifth unit cell arrays M21, M25, M31, M35, M41, and M45 of the second to fourth memory banks BK2 to BK4.

When the first to tenth bits RA<0:9> of the address information are counted as the maximum value, the 11th bit RA<10> of the address information may be counted as a high level, and the first to tenth bits RA<0:9> may become a low level again. Therefore, the first cycle may be ended, and the second cycle may be started. The refresh control signal generator 420 may enable the second refresh control signal 8KREF2 based on the high-level 11th bit RA<10> of the address information and the low-level 12th bit RA<11> of the address information, and disable the first, third and fourth refresh control signals 8KREF1, 8KREF3, and 8KREF4. During the second cycle, the up signal of the second memory bank BK2 may be enabled, and the first to fourth unit cell arrays M21 to M24 may be selected among the first to eighth unit cell arrays M21 to M28 of the second memory bank BK2. Furthermore, based on the high-level 11th bit ROW<10> of the row address signal and the low-level 12th bit ROW<11> of the row address signal, the second unit cell array M22 may be selected among the first to fourth unit cell arrays M21 to M24 of the second memory bank BK2. While the value of the first to tenth bits ROW<0:9> of the row address signal is increased, the row decoder 123 may perform the refresh operation on the second unit cell array M22 of the second memory bank BK2 by sequentially enabling the word lines of the second unit cell array M22 of the second memory bank BK2.

Because the first, third, and fourth refresh control signals 8KREF1, 8KREF3, and 8KREF4 are disabled during the second cycle, the up signals and the down signals of the first, third and fourth memory banks BK1, BK3, and BK4 may be all enabled. Because the 11th bit ROW<10> of the row address signal is at a high level and the 12th bit ROW<11> is at a low level, the row decoder 123 may select the second unit cell arrays M12, M32, and M42 and the sixth unit cell arrays M16, M36, and M46 of the first, third, and fourth memory banks BK1, BK3, and BK4. When the value of the first to tenth bits ROW<0:9> of the row address signal is sequentially increased, the row decoder 123 may perform the refresh operation on the second and sixth unit cell arrays M12, M16, M32, M36, M42, and M46 of the first, third, and fourth memory banks BK1, BK3, and BK4 by sequentially enabling the word lines of the second and sixth unit cell arrays M12, M16, M32, M36, M42, and M46 of the first, third, and fourth memory banks BK1, BK3, and BK4.

When the first to tenth bits RA<0:9> of the address information are counted as the maximum value, the 12th bit RA<11> of the address information may be counted as a high level, and the first to 11th bits RA<0:10> may become a low level again. Therefore, the second cycle may be ended, and the third cycle may be started. The refresh control signal generator 420 may enable the third refresh control signal 8KREF3 based on the low-level 11th bit RA<10> of the address information and the high-level 12th bit RA<11> of the address information, and disable the first, second, and fourth refresh control signals 8KREF1, 8KREF2, and 8KREF4. During the third cycle, the up signal of the third memory bank BK3 may be enabled, and the first to fourth unit cell arrays M31 to M34 may be selected among the first to eighth unit cell arrays M31 to M38 of the third memory bank BK3. Furthermore, based on the low-level 11th bit ROW<10> of the row address signal and the high-level 12th bit ROW<11> of the row address signal, the third unit cell array M33 may be selected among the first to fourth unit cell arrays M31 to M34 of the third memory bank BK3. While the value of the first to tenth bits ROW<0:9> of the row address signal is increased, the row decoder 123 may perform the refresh operation on the third unit cell array M33 of the third memory bank BK3 by sequentially enabling the word lines of the third unit cell array M33 of the third memory bank BK3.

Because the first, second, and fourth refresh control signals 8KREF1, 8KREF2, and 8KREF4 are disabled during the third cycle, the up signals and the down signals of the first, second, and fourth memory banks BK1, BK2, and BK4 may be all enabled. Because the 11th bit ROW<10> of the row address signal is at a low level and the 12th bit ROW<11> is at a high level, the row decoder 123 may select the third unit cell arrays M13, M23, and M43 and the seventh unit cell arrays M17, M27, and M47 of the first, second, and fourth memory banks BK1, BK2, and BK4. When the value of the first to tenth bits ROW<0:9> of the row address signal is sequentially increased, the row decoder 123 may perform the refresh operation on the third and seventh unit cell arrays M13, M17, M23, M27, M43, and M47 of the first, second, and fourth memory banks BK1, BK2, and BK4 by sequentially enabling the word lines of the third and seventh unit cell arrays M13, M17, M23, M27, M43, and M47 of the first, second, and fourth memory banks BK1, BK2, and BK4.

When the first to tenth bits RA<0:9> of the address information are counted as the maximum value, the 11th and 12th bits RA<10:11> of the address information may be counted as a high level, and the first to tenth bits RA<0:9> may become a low level again. Therefore, the third cycle may be ended, and the fourth cycle may be started. The refresh control signal generator 420 may enable the fourth refresh control signal 8KREF4 and disable the first to third refresh control signals 8KREF1, 8KREF2, and 8KREF3, based on the high-level 11th and 12th bits RA<10:11> of the address information. During the fourth cycle, the up signal of the fourth memory bank BK4 may be enabled, and the first to fourth unit cell arrays M41 to M44 may be selected among the first to eighth unit cell arrays M41 to M48 of the fourth memory bank BK4. Furthermore, based on the high-level 11th and 12th bits ROW<10:11> of the row address signal, the fourth unit cell array M44 may be selected among the first to fourth unit cell arrays M41 to M44 of the fourth memory bank BK4. While the value of the first to tenth bits ROW<0:9> of the row address signal is increased, the row decoder 123 may perform the refresh operation on the fourth unit cell array M44 of the fourth memory bank BK4 by sequentially enabling the word lines of the fourth unit cell array M44 of the fourth memory bank BK4.

Because the first to third refresh control signals 8KREF1, 8KREF2, and 8KREF3 are disabled during the fourth cycle, the up signals and the down signals of the first to third memory banks BK1 to BK3 may be all enabled. Because the 11th and 12th bits ROW<10:11> of the row address signal are all at a high level, the row decoder 123 may select the fourth unit cell arrays M14, M24, and M34 and the eighth unit cell arrays M18, M28, and M38 of the first to third memory banks BK1 to BK3. When the value of the first to tenth bits ROW<0:9> of the row address signal is sequentially increased, the row decoder 123 may perform the refresh operation on the fourth and eighth unit cell arrays M14, M18, M24, M28, M34, and M38 of the first to third memory banks BK1 to BK3 by sequentially enabling the word lines of the fourth and eighth unit cell arrays M14, M18, M24, M28, M34, and M38 of the first to third memory banks BK1 to BK3. During the first to fourth cycles, the fifth unit cell array M15 of the first memory bank BK1, the sixth unit cell array M26 of the second memory bank BK2, the seventh unit cell array M37 of the third memory bank BK3 and the eighth unit cell array M48 of the fourth memory bank BK4 were not refreshed.

When the first to 12th bits RA<0:11> of the address information are counted as the maximum value, the 14th bit RA<13> of the address information may be counted as a high level, and the first to tenth bits RA<0:9> may become a low level again. As the 14th bit RA<13> of the address information becomes a high level, the additional cycle may be performed. The refresh control signal generator 420 may enable the additional refresh signal EXREF based on the 14th bit RA<13> of the address information. As the additional refresh signal EXREF is enabled, the first to fourth refresh control signals 8KREF1, 8KREF2, 8KREF3, and 8KREF4 may be all enabled. The third address driver 434 of the first memory bank BK1 may enable the down signal DN based on the additional refresh signal EXREF, and the third address drivers of the second to fourth memory banks BK2 to BK4 may also enable the down signal DN. The second address driver 433 of the first memory bank BK1 may generate the 11th and 12th bits ROW<10:11> of the row address signal which have a preset level, based on the additional refresh signal EXREF. The second address driver 433 may generate the 11th and 12th bits ROW<10:11> of the row address signal which have a low level. The second address driver of the second memory bank BK2 may generate the 11th bit ROW<10> of the row address signal, which has a high level, and the 12th bit ROW<11> of the row address signal, which has a low level. The second address driver of the third memory bank BK3 may generate the 11th bit ROW<10> of the row address signal, which has a low level, and the 12th bit ROW<11> of the row address signal, which has a high level. The second address driver of the fourth memory bank BK4 may generate the 11th and 12th bits ROW<10:11> of the row address signal which have a high level. Therefore, the row decoder 123 may select the fifth unit cell array M15 of the first memory bank BK1, the sixth unit cell array M26 of the second memory bank BK2, the seventh unit cell array M37 of the third memory bank BK3 and the eighth unit cell array M48 of the fourth memory bank BK4. As the value of the first to tenth bits RA<0:9> of the row address signal is increased, the row decoder 123 may perform the additional refresh operation on the fifth unit cell array M15 of the first memory bank BK1, the sixth unit cell array M26 of the second memory bank MK2, the seventh unit cell array M37 of the third memory bank BK3, and the eighth unit cell array M48 of the fourth memory bank BK4 by sequentially enabling the word lines of the fifth unit cell array M15 of the first memory bank BK1, the sixth unit cell array M26 of the second memory bank BK2, the seventh unit cell array M37 of the third memory bank BK3, and the eighth unit cell array M48 of the fourth memory bank BK4. When the additional cycle is ended, a counting reset signal CNTRST may be enabled, the address counter 411 may be reset, and the refresh operation of the semiconductor memory apparatus may be ended.

FIG. 10 shows a timing diagram illustrating the operation of the semiconductor memory apparatus in accordance with the present embodiment in the second refresh mode. Referring to FIGS. 1 to 8 and 10, the operation of the semiconductor memory apparatus in accordance with the present embodiment will be described as follows. When a refresh operation is performed, the refresh signal REF may continuously toggle, and the address counter 411 may sequentially increase the value of the address information RA<0: 11, 13> whenever the refresh signal REF toggles. In the second refresh mode, the second refresh mode signal R8242 may be enabled, and the first refresh mode signal 88143 may be disabled. Because the 12th bit RA<11> of the address information is at a low level in the first cycle, the refresh control signal generator 420 may enable the first and second refresh control signals 8KREF1 and 8KREF2, and disable the third and fourth refresh control signals 8KREF3 and 8KREF4. Because the 14th bit RA<13> of the address information retains a low level, the additional refresh signal EXREF may also retain a disabled state. The address repeater 412 may output the high-level 13th bit ATRA<12> of the address signal. The third driver 810 of the third address driver 434 may generate the 13th bit ROW<12> of the row address signal by strobing the high-level 13th bit ATRA<12> of the address signal with the third strobe signal REFD, and the up/down selector 820 may enable the up signal UP. The third address driver of the second memory bank BK2 may also enable the up signal. The row decoder 123 may select the upper unit cell arrays of the first and second memory banks BK1 and BK2 based on the up signal. That is, the row decoder 123 may select the first to fourth unit cell arrays M11 to M14 and M21 to M24 among the first to eighth unit cell arrays M11 to M18 and M21 to M28 of the first and second memory banks BK1 and BK2 illustrated in FIG. 3B. The second address driver 433 of the first memory bank BK1 may generate the 11th and 12th bits ROW<10:11> of the row address signal by strobing the low-level 11th and 12th bits ATRA<10:11> of the address signal with the second strobe signal ACTFB1011. Therefore, the row decoder 123 may select the first unit cell array M11 among the first to fourth unit cell arrays M11 to M14 of the first memory bank BK1 based on the 11th and 12th bits ROW<10:11> of the row address signal. The second address driver of the second memory bank BK2 may also generate the low-level 11th and 12th bits of the row address signal, and the row decoder 123 may select the first unit cell array M21 among the first to fourth unit cell arrays M21 to M24 of the second memory bank BK2. The first address driver 432 of the first memory bank BK1 may generate the first to tenth bits ROW<0:9> of the row address signal by strobing the first to tenth bits ATRA<0:9> of the address signal with the first strobe signal ACTFB. The first address driver 432 may sequentially increase the value of the row address signal ROW<0:9> when the address signal ATRA<0:9> is counted, and the row decoder 123 may perform the refresh operation on the first unit cell array M11 by sequentially enabling the word lines of the first unit cell array M11 of the first memory bank BK1. Similarly, the first address driver of the second memory bank BK2 may sequentially increase the value of the first to tenth bits of the row address signal, and the row decoder 123 may perform the refresh operation on the first unit cell array M21 by sequentially enabling the word lines of the first unit cell array M21 of the second memory bank BK2.

Because the third and fourth refresh control signals 8KREF3 and 8KREF4 are disabled during the first cycle, the up signals and the down signals of the third and fourth memory banks BK3 and BK4 may be all enabled. Because the 11th and 12th bits ROW<10:11> of the row address signal are at a low level, the row decoder 123 may select the first unit cell arrays M31 and M41 and the fifth unit cell arrays M35 and M45 of the third and fourth memory banks BK3 and BK4, When the value of the first to tenth bits ROW<0:9> of the row address signal is sequentially increased, the row decoder 123 may perform the refresh operation on the first and fifth unit cell arrays M31, M35, M41, and M45 of the third and fourth memory banks BK3 and BK4 by sequentially enabling the word lines of the first and fifth unit cell arrays M31, M35, M41, and M45 of the third and fourth memory banks BK3 and BK4.

When the first to tenth bits RA<0:9> of the address information are counted as the maximum value, the 11th bit RA<10> of the address information may be counted as a high level, and the first to tenth bits RA<0:9> may become a low level again. Therefore, the first cycle may be ended, and the second cycle may be started. Because the 12th bit RA<11> of the address information still has a low level, the refresh control signal generator 420 may retain the enabled state of the first and second refresh control signals 8KREF1 and 8KREF2, and retain the disabled state of the third and fourth refresh control signals 8KREF3 and 8KREF4. During the second cycle, the up signals of the first and second memory banks BK1 and BK2 may be enabled, and the first to fourth unit cell arrays M11 to M14 and M21 to M24 may be selected among the first to eighth unit cell arrays M11 to M18 and M21 to M28 of the first and second memory banks BK1 and BK2. Furthermore, based on the high-level 11th bit ROW<10> of the row address signal and the low-level 12th bit ROW<11> of the row address, the second unit cell arrays M12 and M22 may be selected among the first to fourth unit cell arrays M11 to M14 and M21 to M24 of the first and second memory banks BK1 and BK2. As the value of the first to tenth bits ROW<0:9> of the row address signal is increased, the row decoder 123 may perform the refresh operation on the second unit cell arrays M12 and M22 of the first and second memory banks BK1 and BK2 by sequentially enabling the word lines of the second unit cell arrays M12 and M22 of the first and second memory banks BK1 and BK2.

Because the third and fourth refresh control signals 8KREF3 and 8KREF4 are disabled during the second cycle, the up signals and the down signals of the third and fourth memory banks BK3 and BK4 may be all enabled. Because the 11th bit ROW<10> of the row address signal is at a high level and the 12th bit ROW<11> is at a low level, the row decoder 123 may select the second unit cell arrays M32 and M42 and the sixth unit cell arrays M36 and M46 of the third and fourth memory banks BK3 and BK4. When the value of the first to tenth bits ROW<0:9> of the row address signal is sequentially increased, the row decoder 123 may perform the refresh operation on the second and sixth unit cell arrays M32, M36, M42, and M46 of the third and fourth memory banks BK3 and BK4 by sequentially enabling the word lines of the second and sixth unit cell arrays M32, M36, M42, and M46 of the third and fourth memory banks BK3 and BK4.

When the first to tenth bits RA<0:9> of the address information are counted as the maximum value, the 12th bit RA<11> of the address information may be counted as a high level, and the first to 11th bits RA<0:10> may become a low level again. Therefore, the second cycle may be ended, and the third cycle may be started. The refresh control signal generator 420 may enable the third and fourth refresh control signals 8KREF3 and 8KREF4 and disable the first and second refresh control signals 8KREF1 and 8KREF2, based on the high-level 12th bit RA<11> of the address information. During the third cycle, the up signals of the third and fourth memory banks BK3 and BK4 may be enabled, and the first to fourth unit cell arrays M31 to M34 and M41 to M44 may be selected among the first to eighth unit cell arrays M31 to M38 and M41 to M48 of the third and fourth memory banks BK3 and BK4. Furthermore, based on the low-level 11th bit ROW<10> of the row address signal and the high-level 12th bit ROW<11> of the row address signal, the third unit cell arrays M33 and M43 may be selected among the first to fourth unit cell arrays M31 to M34 and M41 to M44 of the third and fourth memory banks BK3 and BK4. As the value of the first to tenth bits ROW<0:9> of the row address signal is increased, the row decoder 123 may perform the refresh operation on the third unit cell arrays M33 and M43 of the third and fourth memory banks BK3 and BK4 by sequentially enabling the word lines of the third unit cell arrays M33 and M43 of the third and fourth memory banks BK3 and BK4.

Because the first and second refresh control signals 8KREF1 and 8KREF2 are disabled during the third cycle, the up signals and the down signals of the first and second memory banks BK1 and BK2 may be all enabled. Because the 11th bit ROW<10> of the row address signal is at a low level and the 12th bit ROW<11> is at a high level, the row decoder 123 may select the third unit cell arrays M13 and M23 and the seventh unit cell arrays M17 and M27 of the first and second memory banks BK1 and BK2. When the value of the first to tenth bits ROW<0:9> of the row address signal is sequentially increased, the row decoder 123 may perform the refresh operation on the third and seventh unit cell arrays M13, M17, M23, and M27 of the first and second memory banks BK1 and BK2 by sequentially enabling the word lines of the third and seventh unit cell arrays M13, M17, M23, and M27 of the first and second memory banks BK1 and BK2.

When the first to tenth bits RA<0:9> of the address information are counted as the maximum value, the 11th and 12th bits RA<10:11> of the address information may be counted as a high level, and the first to tenth bits RA<0:9> may become a low level again. Therefore, the third cycle may be ended, and the fourth cycle may be started. Because the 12th bit RA<11> of the address information still has a high level, the refresh control signal generator 420 may retain the disabled state of the first and second refresh control signals 8KREF1 and 8KREF2, and retain the enabled state of the third and fourth refresh control signals 8KREF3 and 8KREF4. During the fourth cycle, the up signals of the third and fourth memory banks BK3 and BK4 may be enabled, and the first to fourth unit cell arrays M31 to M34 and M41 to M44 may be selected among the first to eighth unit cell arrays M31 to M38 and M41 to M48 of the third and fourth memory banks BK3 and BK4. Furthermore, based on the high-level 11th and 12th bits ROW<10:11> of the row address signal, the fourth unit cell arrays M34 and M44 may be selected among the first to fourth unit cell arrays M31 to M34 and M41 to M44 of the third and fourth memory banks BK3 and BK4. As the value of the first to tenth bits ROW<0:9> of the row address signal is increased, the row decoder 123 may perform the refresh operation on the fourth unit cell arrays M34 and M44 of the third and fourth memory banks BK3 and BK4 by sequentially enabling the word lines of the fourth unit cell arrays M34 and M44 of the third and fourth memory banks BK3 and BK4.

Because the first and second refresh control signals 8KREF1 and 8KREF2 are disabled during the fourth cycle, the up signals and the down signals of the first and second memory banks BK1 and BK2 may be all enabled. Because the 11th and 12th bits ROW<10:11> of the row address signal are all at a high level, the row decoder 123 may select the fourth unit cell arrays M14 and M24 and the eighth unit cell arrays M18 and M28 of the first and second memory banks BK1 and BK2. When the value of the first to tenth bits ROW<0:9> of the row address signal is sequentially increased, the row decoder 123 may perform the refresh operation on the fourth and eighth unit cell arrays M14, M18, M24, and M28 of the first and second memory banks BK1 and BK2 by sequentially enabling the word lines of the fourth and eighth unit cell arrays M14, M18, M24, and M28 of the first and second memory banks BK1 and BK2. During the first to fourth cycles, the fifth and sixth unit cell arrays M15, M16, M25, and M26 of the first and second memory banks BK1 and BK2 and the seventh and eighth unit cell arrays M37, M38, M47, and M48 of the third and fourth memory banks BK3 and BK4 were not refreshed.

When the first to 12th bits RA<0:11> of the address information are counted as the maximum value, the 14th bit RA<13> of the address information may be counted as a high level, and the first to 11th bits RA<0:10> may become a low level again. As the 14th bit RA<13> of the address information becomes a high level, the additional cycle may be performed. The refresh control signal generator 420 may enable the additional refresh signal EXREF based on the 14th bit RA<13> of the address information. When the additional refresh signal EXREF is enabled, the first to fourth refresh control signals 8KREF1 to 8KREF4 may be all enabled. The third address driver 434 of the first memory bank BK1 may enable the down signal DN based on the additional refresh signal EXREF, and the third address drivers of the second to fourth memory banks BK2 to BK4 may also enable the down signal DN. The second address driver 433 may generate the 11th bit ROW<10> of the row address signal based on the low-level 11th bit ATRA<10> of the address signal. The second address driver 433 of the first memory bank BK1 may generate the 12th bit ROW<11> of the row address signal, which has a preset level, based on the additional refresh signal EXREF. The second address driver 433 of the first memory bank BK1 may generate the 12th bit ROW<11> of the row address signal, which has a low level. The second address driver 433 of the second memory bank BK2 may generate the 12th bit ROW<11> of the row address signal, which has a low level. The second address driver of the third memory bank BK3 may generate the 12th bit ROW<11> of the row address signal, which has a high level. The second address driver of the fourth memory bank BK4 may generate the 12th bit ROW<11> of the row address signal, which has a high level. Therefore, the row decoder 123 may select the fifth unit cell arrays M15 and M25 of the first and second memory banks BK1 and BK2 and the seventh unit cell arrays M37 and M47 of the third and fourth memory banks BK3 and BK4. As the value of the first to tenth bits ROW<0:9> of the row address signal is increased, the row decoder 123 may perform the additional refresh operation on the fifth unit cell arrays M15 and M25 of the first and second memory banks BK1 and BK2 and the seventh unit cell arrays M37 and M47 of the third and fourth memory banks BK3 and BK4 by sequentially enabling the word lines of the fifth unit cell arrays M15 and M25 of the first and second memory banks BK1 and BK2 and the seventh unit cell arrays M37 and M47 of the third and fourth memory banks BK3 and BK4.

When the first to tenth bits RA<0:9> of the address information are counted as the maximum value, the 11th bit RA<10> of the address information may be counted as a high level, and the first to tenth bits RA<0:9> may become a low level again. The second address driver 433 may generate the 11th bit ROW<10> of the row address signal based on the high-level 11th bit ATRA<10> of the address signal. Therefore, the row decoder 123 may select the sixth unit cell arrays M16 and M26 of the first and second memory banks BK1 and BK2 and the eighth unit cell arrays M38 and M48 of the third and fourth memory banks BK3 and BK4. As the value of the first to tenth bits ROW<0:9> of the row address signal is increased, the row decoder 123 may perform the additional refresh operation on the sixth unit cell arrays M16 and M26 of the first and second memory banks BK1 and BK2 and the eighth unit cell arrays M38 and M48 of the third and fourth memory banks BK3 and BK4 by sequentially enabling the word lines of the sixth unit cell arrays M16 and M26 of the first and second memory banks BK1 and BK2 and the eighth unit cell arrays M38 and M48 of the third and fourth memory banks BK3 and BK4. When the additional cycle is ended, the counting reset signal CNTRST may be enabled, the address counter 411 may be reset, and the refresh operation of the semiconductor memory apparatus may be ended.

While a limited number of possible embodiments have been described above, it will be understood to those skilled in the art that the described embodiments serve as examples only. Accordingly, the operating method of a data storage device described herein should not be limited based on the described embodiments.

What is claimed is:

1. A semiconductor memory apparatus comprising:
 a plurality of memory banks; and
 a refresh control circuit configured to, in each plurality of cycles, perform a refresh operation on at least one memory bank of the plurality of memory banks at a first refresh rate and perform a refresh operation on the all other memory banks of the plurality of memory banks at a second refresh rate,
 wherein the refresh control circuit circulates the at least one memory bank on which the refresh operation is performed at the first refresh rate in each one or more cycles of the plurality of cycles.

2. The semiconductor memory apparatus according to claim 1, wherein one unit cell array is refreshed in one cycle when the refresh operation is performed at the first refresh rate, and wherein two unit cell arrays are refreshed in one cycle when the refresh operation is performed at the second refresh rate.

3. The semiconductor memory apparatus according to claim 1, wherein the refresh control circuit performs the refresh operation on one memory bank of the plurality of memory banks at the first refresh rate and performs the refresh operation on the other memory banks at the second refresh rate, in each plurality of cycles in a first refresh mode, and wherein the refresh control circuit performs the refresh operation on two memory banks of the plurality of memory banks at the first refresh rate and performs the refresh operation on the other memory banks at the second refresh rate, in each plurality of cycles in a second refresh mode.

4. The semiconductor memory apparatus according to claim 1, wherein the refresh control circuit performs an additional refresh operation on unit cell arrays of the plurality of memory banks that are not refreshed in the plurality of cycles.

5. The semiconductor memory apparatus according to claim 4, wherein the additional refresh operation is performed at one of the first refresh rate and the second refresh rate.

6. The semiconductor memory apparatus according to claim 1, wherein the plurality of memory banks comprise first, second, third, and fourth memory banks, wherein each of the first, second, third, and fourth memory banks comprises first to (2n)th unit cell arrays where n is an integer equal to or greater than 2, and wherein the refresh control circuit performs the refresh operation on the first to fourth memory banks through (n+1) cycles.

7. The semiconductor memory apparatus according to claim 6, wherein the refresh control circuit, during a first cycle, performs a refresh operation on a first unit cell array of the first memory bank, and performs a refresh operation on first unit cell arrays and (n+1)th unit cell arrays of the second, third, and fourth memory banks.

8. The semiconductor memory apparatus according to claim 7, wherein the refresh control circuit, during a second cycle, performs a refresh operation on a second unit cell array of the second memory bank, and performs a refresh operation on second unit cell arrays and (n+2)th unit cell arrays of the first, third, and fourth memory banks.

9. The semiconductor memory apparatus according to claim 8, wherein the refresh control circuit, during a third cycle, performs a refresh operation on a third unit cell array of the third memory bank, and performs a refresh operation on third unit cell arrays and (n+3)th unit cell arrays of the first, second, and fourth memory banks.

10. The semiconductor memory apparatus according to claim 9, wherein the refresh control circuit, during a fourth cycle, performs a refresh operation on a fourth unit cell array of the fourth memory bank, and performs a refresh operation on fourth unit cell arrays and (n+4)th unit cell arrays of the first to third memory banks.

11. The semiconductor memory apparatus according to claim 10, wherein the refresh control circuit, during an (n+1)th cycle, performs a refresh operation on an (n+1)th unit cell array of the first memory bank, an (n+2)th unit cell array of the second memory bank, an (n+3)th unit cell array of the third memory bank and an (n+4)th unit cell array of the fourth memory bank.

12. The semiconductor memory apparatus according to claim 6, wherein the refresh control circuit, during a first cycle, performs a refresh operation on first unit cell arrays of the first and second memory banks, and performs a refresh operation on first unit cell arrays and (n+1)th unit cell arrays of the third and fourth memory banks.

13. The semiconductor memory apparatus according to claim 12, wherein the refresh control circuit, during a second cycle, performs a refresh operation on second unit cell arrays of the first and second memory banks, and performs a refresh operation on second unit cell arrays and (n+2)th unit cell arrays of the third and fourth memory banks.

14. The semiconductor memory apparatus according to claim 13, wherein the refresh control circuit, during a third cycle, performs a refresh operation on third unit cell arrays of the third and fourth memory banks, and performs a refresh operation on third unit cell arrays and (n+3)th unit cell arrays of the first and second memory banks.

15. The semiconductor memory apparatus according to claim 14, wherein the refresh control circuit, during a fourth cycle, performs a refresh operation on fourth unit cell arrays of the third and fourth memory banks, and performs a refresh operation on fourth unit cell arrays and (n+4)th unit cell arrays of the first and second memory banks.

16. The semiconductor memory apparatus according to claim 15, wherein the refresh control circuit, during an (n+1)th cycle, performs a refresh operation on (n+1)th unit cell arrays and (n+2)th unit cell arrays of the first and second memory banks and (n+3)th unit cell arrays and (n+4)th unit cell arrays of the third and fourth memory banks.

17. The semiconductor memory apparatus according to claim 1, wherein the refresh control circuit comprises:
an address generator configured to generate address information based on a refresh signal, and to generate an address signal from the address information;
a refresh control signal generator configured to generate at least one refresh control signal and an additional refresh signal based on at least a part of the address information and a refresh mode signal; and
a plurality of address mappers provided for the respective memory banks, and configured to generate a row address signal based on the refresh signal, the refresh mode signal, the address signal, an assigned refresh control signal, and the additional refresh signal.

18. The semiconductor memory apparatus according to claim 17, wherein the address generator comprises:

an address counter configured to increase the value of the address information by counting the address information based on the refresh signal; and
an address repeater configured to generate the address signal by repeating the address information.

19. The semiconductor memory apparatus according to claim 17, wherein the refresh mode signal comprises a first refresh mode signal and a second refresh mode signal, and
wherein the at least one refresh control signal comprises a plurality of refresh control signals, and wherein the refresh control signal generator enables one refresh control signal of the plurality of refresh control signals and disables the other refresh control signals, based on logic levels of at least first and second bits of the address information, when the first refresh mode signal is enabled, and enables two refresh control signals of the plurality of refresh control signals and disables the other refresh control signals, based on the logic level of at least the second bit of the address information, when the second refresh mode signal is enabled.

20. The semiconductor memory apparatus according to claim 19, wherein the refresh control signal generator enables the additional refresh signal based on a logic level of at least a third bit of the address information.

21. The semiconductor memory apparatus according to claim 17, wherein at least one of the plurality of address mappers comprise:
a strobe signal generator configured to generate first and second strobe signals based on an active pulse and the additional refresh signal, and generate a third strobe signal based on the refresh signal;
a first address driver configured to strobe at least a part of the address signal with the first strobe signal, and output the strobed signal as at least a part of a row address signal;
a second address driver configured to strobe first and second bits of the address signal with the second strobe signal, output the strobed bits as first and second bits of the row address signal, and fix one or more of the first and second bits of the row address signal to a predetermined logic level based on the refresh mode signal and the additional refresh signal; and
a third address driver configured to generate a third bit of the row address signal by strobing one of a third bit of the address signal and a predetermined voltage with the third strobe signal, based on the additional refresh signal, and generate an up signal and a down signal based on a third bit of the third row address signal and the assigned refresh control signal.

22. The semiconductor memory apparatus according to claim 21, wherein the second address driver fixes the first and second bits to a predetermined logic level and outputs the fixed bits as the first and second bits of the row address signal when the additional refresh signal is enabled in a first refresh mode, and fixes the second bit to the predetermined logic level and outputs the fixed bit as the second bit of the row address signal when the additional refresh signal is enabled in a second refresh mode.

23. A refresh method of a semiconductor memory apparatus which includes first and second memory banks each having at least four unit cell arrays, the refresh method comprising:
Performing, during a first cycle, a refresh operation on a first unit cell array of the first memory bank, and performing a refresh operation on first and third unit cell arrays of the second memory bank; and performing, during a second cycle, a refresh operation on second and fourth unit cell arrays of the first memory bank, and performing a refresh operation on second unit cell array of the second memory bank; and performing, during an additional cycle, a refresh operation on a third unit cell array of the first memory bank and a fourth unit cell array of the second memory bank.

24. A refresh method of a semiconductor memory apparatus which includes first, second, third, and fourth memory banks each having at least eight unit cell arrays, the refresh method comprising:

performing, during a first cycle, a refresh operation on a first unit cell array of the first memory bank, and performing a refresh operation on first and fifth unit cell arrays of the second, third, and fourth memory banks; and performing, during a second cycle, a refresh operation on second unit cell arrays of the second memory bank, and performing a refresh operation on second and sixth unit cell arrays of the first, third, and fourth memory banks;

performing, during a third cycle, a refresh operation on a third unit cell array of the third memory bank, and performing a refresh operation on third and seventh unit cell arrays of the first, second and fourth memory banks;

performing, during a fourth cycle, a refresh operation on a fourth unit cell array of the fourth memory bank, and performing a refresh operation on fourth and eighth unit cell arrays of the first to third memory banks; and performing, during an additional cycle, a refresh operation on a fifth unit cell array of the first memory bank, a sixth unit cell array of the second memory bank, a seventh unit cell array of the third memory bank, and an eighth unit cell array of the fourth memory bank.

25. A refresh method of a semiconductor memory apparatus which includes first and fourth memory banks each having at least eight unit cell arrays, the refresh method comprising:

performing, during a first cycle, a refresh operation on first unit cell arrays of the first and second memory banks, and performing a refresh operation on first and fifth unit cell arrays of the third and fourth memory banks; and performing, during a second cycle, a refresh operation on second unit cell arrays of the first and second memory banks, and performing a refresh operation on second and sixth unit cell arrays of the third and fourth memory banks;

performing, during a third cycle, a refresh operation on third and seventh unit cell arrays of the first and second memory banks, and performing a refresh operation on third unit cell arrays of the third and fourth memory banks;

performing, during a fourth cycle, a refresh operation on fourth and eighth unit cell arrays of the first and second memory banks, and performing a refresh operation on fourth unit cell arrays of the third and fourth memory banks; and performing, during an additional cycle, a refresh operation on fifth and sixth unit cell arrays of the first and second memory banks and seventh and eighth unit cell arrays of the third and fourth memory banks.

* * * * *